(12) United States Patent
Craven et al.

(10) Patent No.: US 6,774,820 B2
(45) Date of Patent: Aug. 10, 2004

(54) MATRIX IMPROVEMENTS TO LOSSLESS ENCODING AND DECODING

(75) Inventors: Peter Graham Craven, West Sussex (GB); Malcolm James Law, West Sussex (GB); John Robert Stuart, Cambridge (GB)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 10/643,073

(22) Filed: Aug. 18, 2003

(65) Prior Publication Data

US 2004/0070523 A1 Apr. 15, 2004

Related U.S. Application Data

(63) Continuation of application No. 09/958,200, filed as application No. PCT/GB00/01308 on Apr. 7, 2000, now Pat. No. 6,611,212.

(30) Foreign Application Priority Data

Apr. 7, 1999 (GB) ............................................. 99007918
Apr. 7, 1999 (GB) ............................................. 99007919

(51) Int. Cl.[7] ............................................... H03M 7/00
(52) U.S. Cl. ........................................ 341/50; 341/200
(58) Field of Search ............................. 341/50, 51, 60, 341/143, 87, 200; 375/240.03, 340

(56) References Cited

U.S. PATENT DOCUMENTS

| 5,715,187 | A | 2/1998 | Chen et al. | ................. 708/620 |
| 5,731,837 | A | 3/1998 | Hurst, Jr. | ............... 375/240.03 |
| 5,848,106 | A | 12/1998 | Khayrallah | ................. 375/340 |
| 6,664,913 | B1 * | 12/2003 | Craven et al. | ............... 341/200 |

FOREIGN PATENT DOCUMENTS

| EP | 0631458 | 12/1994 |
| WO | 9637048 | 11/1996 |

OTHER PUBLICATIONS

Adil Benyassine et al., "Multiband CELP Coding of Speech", IEEE Proc. of the Asilomar Conference on Sig., Sys. and Computers, vol. CONF. 24, New York, Nov. 5, 1990.

Fuchs H., "Improving Joint Stereo Audio Coding by Adaptive Inter–Channel Prediction", IEEE Workshop on Applications of Signal Proc. to Audio and Acoust., Oct. 17, 1993.

Bill Kath, "Gaussian Elimination with Row Exchanges (.partial pivoting)": McCormick School of Engineering and Applied Science, Illinois, Course Material (no date).

J.R. Stuart, "A Proposal for the High–Quality Audio Application of High–Density CD Carriers": Technical Subcommittee of Acoustic Renaissance for Audio, Jan. 1996.

Warner R. Th. Ten Kate, "Compatibility Matrixing of Multichannel Bit–Rate Reduced Audio Signals", New York: J. of the Audio Eng. Soc., vol. 44, No. 12 (no date).

* cited by examiner

*Primary Examiner*—Jean Bruner Jeanglaude
(74) *Attorney, Agent, or Firm*—David N. Lathrop, Esq.; Gallagher & Lathrop

(57) ABSTRACT

A lossless encoder and decoder are provided for transmitting a multichannel signal on a medium such as DVD-Audio. The encoder accepts additionally a downmix specification and splits the encoded stream into two substreams, such that a two-channel decoder of meagre computational power can implement the downmix specification by decoding one substream, while a multichannel decoder can decode the original multichannel signal losslessly using both substreams. Further features provide for efficient implementation on 24-bit processors, for confirmation of lossless reproduction to the user, and for benign behaviour in the case of downmix specifications that result in overload. The principle is also extended to mixed-rate signals, where for example some input channels are sampled at 48 kHz and some are sampled at 96 kHz.

99 Claims, 6 Drawing Sheets

Encoding quantiser

Decoding quantiser

US 6,774,820 B2

MATRIX IMPROVEMENTS TO LOSSLESS ENCODING AND DECODING

FIELD OF INVENTION

The invention relates to the encoding and decoding of digital signal streams, particularly digital audio streams, with reference to matrixing multichannel signals.

BACKGROUND TO THE INVENTION

Lossless compression is now an established means of reducing the data rate required for storing or transmitting a digital audio signal. One method of reducing the data rate of a multichannel signal is to apply matrixing so that dominant information is concentrated in some of the transmitted channels while the other channels carry relatively little information. For example, two-channel audio may have nearly the same waveform in the left and right channels if conveying a central sound image, in which case it is more efficient to encode the sum and difference of the two channels. This process is described in some detail in WO-A 96/37048, including the use of a cascade of 'primitive matrix quantisers' to achieve the matrixing in a perfectly invertible or lossless manner.

The process disclosed in WO-A 96/37048 also envisages the use of matrix quantisers to apply a matrix to a multichannel original digital signal in order to derive matrixed digital signals representing speaker feeds more suitable for general domestic listening. These matrixed signals may be recorded on a carrier such as a DVD, and the ordinary player will simply feed each matrixed signal to a loudspeaker. The advanced player, however, may invert the effect of the matrix quantisers and thus reconstruct the original digital signal exactly in order to reproduce it in an alternative manner.

In a commercial application of DVD-Audio there is a requirement to combine the above two concepts so that a transmission system using lossless compression may also provide both a matrixed signal and an original signal. In this application the required matrixed signal has two channels whereas the original signal has more than two channels, thus additional information must be provided to allow the multichannel signal to be recovered; however, the additional information should not impose a computational overhead for decoders that wish to decode the two-channel matrixed signal only.

Currently, digital audio is often transmitted with 24 bits, and popular Digital Signal Processing (DSP) chips designed for audio such as the Motorola 56000 series also easily handle a 24-bit word. However the processing described in WO-A 96/37048 can generate numbers requiring a word width greater than the original signal. Because the use of 'double-precision' computation is prohibitively expensive, a method is needed to allow the processing to be substantially carried out while not requiring an increased word width.

Finally the consumer, having bought equipment designed to provide lossless reproduction, would like reassurance that the signal recovered is indeed lossless. Conventional parity and CRC checks within the encoded stream will show errors due to data corruption within the stream, but they will not expose errors due to matrixing or other algorithmic mismatch between an encoder and a decoder.

SUMMARY OF THE INVENTION

According to a first aspect of the invention, there is provided a stream divided into two substreams, the first substream providing information relating to a 'downmix' signal obtained by matrixing and containing fewer channels than an original multichannel digital signal, and the second substream providing additional information allowing the original multichannel digital signal to be losslessly recovered by a decoder. In the context where both substreams are conveyed using lossless compression, a decoder that decodes only the downmix signal needs to decompress the first substream only and can therefore use fewer computational resources than are required to decode the multichannel digital signal.

In a variant of this first aspect, the first substream may be replaced by a plurality of substreams. allowing a plurality of different matrixed presentations to be selected. Again however, the last substream will contain additional information that allows a complete original multichannel digital signal to be reproduced losslessly.

In a preferred implementation of the first aspect an encoder furnishes the downmix signal using a cascade of one or more primitive matrix quantisers, each of which implements an n by n matrix, followed by selection of the m channels required for the downmix.

A multichannel decoder will take the signals from both substreams and apply a cascade of inverse primitive matrices in order to recover the original multichannel signal. It might be considered natural to order the channels that are input to the decoder's cascade so that the channels from the first substream are placed at the beginning. However this may result in incorrect channel ordering at the output of the decoder's cascade, so preferably a channel permutation is specified by the encoder and implemented by the decoder to recover the correct channel order.

Preferably, any truncation or rounding within the matrixing should be computed using dither. In this case, for lossless coding, the dither signal must be made available to the decoder in order that it may invert the computations performed by the encoder and thus recover the original signal losslessly. The dither may be computed using an 'autodither' method as envisaged in WO-A 96/37048; but in the context of a lossless compression scheme, autodither can be avoided by providing a dither seed in the encoded stream that allows a decoder to synchronize its dithering process to that which was used by the encoder.

Therefore according to a second aspect of the invention, there is provided a lossless compression system including a dither seed in the encoded bitstream. The dither seed is used to synchronise a pseudo-random sequence generator in the decoder with a functionally identical generator in an encoder.

In an important application of the invention, the downmix has two channels, and is most conveniently derived by the application of two primitive matrix quantisers to the original multichannel digital signal. In embodiments that implement the second aspect of the invention, dither is required by each quantiser; moreover different dither should be provided for the two quantisers and the preferred probability distribution function (PDF) for each dither is triangular. An efficient way to furnish two such triangular PDF (TPDF) dither signals, which is referred to herein as 'diamond dither', is to add and subtract two independent rectangular PDF (RPDF) signals. For further details and generalisation to more channels, see R. Wannamaker, "Efficient Generation of Multichannel Dither Signals", AES 103rd Convention, New York, 1997, preprint no. 4533.

Accordingly, in a preferred implementation of the second aspect, the encoder uses a single sequence generator to furnish two independent RPDF dither signals, and the sum and difference of these signals is used to provide the dither required by two primitive matrix quantisers used to derive a two-channel downmix.

WO-A 96/37048 describes the use of primitive matrix quantisers within a lossless compression system. and above we have referred to a preferred implementation of the first aspect, which also uses primitive matrix quantisers in order to place the information required for a 'downmix' signal into a separate substream.

Accordingly, in a third aspect of the invention there are provided encoders and decoders containing uncommitted primitive matrix quantisers, the encoder having logic that accepts a downmix specified as a matrix of coefficients, allocates a number of primitive matrix quantisers to furnish the downmix and optionally allocates a further number to provide matrixing to reduce the data rate. The encoder furnishes a stream containing specifications of the primitive matrix quantisers to be used, and optionally may include the addition of dither. In a preferred implementation, the dither is generated as two RPDF dither sequences, and the encoder specifies a coefficient for each dither sequence. Diamond dither is thus obtainable by specifying two coefficients of the same sign in the case of a first primitive matrix quantiser, and two coefficients of opposite sign in the case of a second primitive matrix quantiser.

In an elementary implementation of the third aspect, the primitive matrices are chosen so that the downmix signals are transmitted directly in the first substream. However, this may not be optimal for several reasons. Considering the n channels of a multichannel subspace as defining an n-dimensional vector space, the signals that result in a nonzero output in a linear downmix will form a subspace. If the downmix has m-channels then the subspace will usually also be of dimension m. The signals in the first substream should then convey the m-dimensional subspace optimally, which may require its transmitted channels to be a matrixed representation of the downmix channels. Thus matrixing facilities are usually needed even by a decoder designed to recover a downmix signal only.

Audio signals are normally conveyed using at most 24 bits, and in a lossless reproduction system such as Meridian Lossless Packing® (MLP), it is guaranteed that the output will not exceed 24 bits because the original input did not exceed 24 bits. A description of MLP may be obtained from DVD Specifications for Read-Only Disc, Part 4: Audio Specifications, Packed PCM, MLP Reference Information, Version 1.0. Mar. 1999, and from WO-A 96/37048. In the case of the downmix, the output level is defined by the matrix in the decoder. In principle one could scale the matrix coefficients so that the output can never exceed the saturation threshold defined by a 24-bit word, but in practice this results in unacceptably low output level. Moreover it is not acceptable for the encoder to limit or clip the downmix signals, as this cannot be done without affecting the reconstructed multichannel signal which would then not be lossless. An output level that exceeds the saturation threshold is referred to herein as 'overload'. Occasional overload of the downmix signal is considered acceptable, except that digital overload, if allowed to 'wrap-round', is extremely objectionable. The consequence of wrap-round is discussed below in more detail. Therefore in a preferred implementation of the first aspect of the invention, a decoder that decodes a downmix signal has clipping or similar limiting facilities after the computation of the matrix so that the effects of overload are not objectionable.

Another consequence of the 24-bit tradition in high quality audio is the availability of DSP processing chips having a 24-bit internal word width. Each primitive matrix quantiser as disclosed in WO-A 96/37048 modifies one channel of a multichannel signal by adding proportions of the other channels. Such a primitive matrix quantiser has a straight-through gain of unity. The invention in a fourth aspect provides for a primitive matrix quantiser that accepts a gain coefficient for the modified channel, and has an additional data path known as lsb_bypass. The gain may be set to a value less than unity in order to avoid overload. The quantised output of the primitive matrix quantiser will then contain less information than its input, with the remaining information being contained in additional least significant bits (LSBs) that are generated by application of the gain coefficient. Some or all of these LSBs are then transmitted separately through the lsb_bypass data path. In particular, in the case of a gain coefficient of $\pm\frac{1}{2}$, a single LSB is generated that can be conveyed through the lsh_bypass.

In a fifth aspect of the invention that provides a 'lossless_check' feature, a check value is computed on the multichannel input to the encoder and is conveyed in the encoded stream. The decoder computes a similar check value from the decoded output and compares it with the check value conveyed within the stream, typically to provide a visual indication such as a 'Lossless' light to the listener that the reproduction is truly lossless. In the case of a stream with a downmix according to the first aspect of the invention, the downmix is not a lossless reproduction of an original signal. Nevertheless, if a synchronised dither is provided in the decoder according to the second aspect, and if the decoder matrixing is precisely described such as, for example, the matrix quantisers according to the third aspect of the invention, then the downmix reproduction is completely deterministic and can be simulated in the encoder and auditioned by a mastering engineer or producer. Therefore the encoder can compute a check value on the simulated downmix and this word can be checked by the decoder, thus confirming lossless reproduction of the same downmix that was auditioned or available for audition in the encoding process.

An encoder that incorporates for example, the 'prequantiser' described in P. G. Craven and J. R. Stuart, 'Cascendable Lossy Data Compression Using a Lossless Kernel', *J. Audio Elig. Soc.*, Abstracts, Mar. 1997, vol. 45, no. 5, p. 404, preprint no. 4416, referred to herein as 'AES 1997', and which can therefore alter the original multichannel signal before encoding, has a choice on the computation of the check value. If it computes the check value from the original signal, an indication of lossless reproduction such as the 'Lossless light' on a decoder will not illuminate during passages that have been altered. An alternative is to make the altered signal available for audition as part of the encoding process, and to compute the check value from the altered signal. This is consistent with the downmix case: in both situations the Lossless light indicates lossless reproduction of a signal that was available for audition at the encoding stage.

In a preferred implementation, the check value is a parity-check word that is computed on all the channels. In an embodiment incorporating the first aspect of the invention, the first substream contains a parity-check word that is computed from the simulated downmix before any modification such as clipping is applied to avoid overload, while the second substream contains a parity-check word computed from the complete multichannel signal. Before computing the parity, the word representing each channel value is rotated by a number of bits equal to the channel number so that an error affecting two channels identically has a high probability of being detected.

Throughout this disclosure, more particular reference is made to encoding processes that record an encoded stream onto storage media such as DVD, and to decoding processes that retrieve the encoded stream from such storage media. It should be understood, however, that encoders implemented according to the invention may be used to send encoded streams using essentially any transmission media including baseband or modulated communication paths throughout the spectrum from supersonic to ultraviolet frequencies, or may be used to record encoded streams onto storage media using essentially any recording technology including magnetic and optical techniques. Similarly, decoders implemented according to the invention may be used to process encoded streams obtained from such media.

BRIEF DESCRIPTION OF THE DRAWINGS

Examples of the present invention will now be described with reference to the accompanying drawings, in which:

FIG. 4b shows a similar cascade of two primitive matrix quantisers, configured to invert the processing of FIG. 4a.

FIG. 7b shows one embodiment of a decoder that is complementary to the encoder of FIG. 7a.

DETAILED DESCRIPTION OF THE INVENTION

Downmix Encoding and Decoding

The article "Lossless Coding for Audio Discs", J. Audio Eng. Soc., Sep. 1996, vol. 44, no. 9, pp. 706–720 and international patent application WO-A 96/37048 contain discussions of some of the principles used in lossless compression.

An important commercial application of lossless compression is on DVD-Audio, where there are two classes of player: the multichannel player furnishing 6 outputs used typically to drive a '5.1' speaker layout, and the two channel player furnishing two outputs for listeners with two loudspeakers or for portable use with headphones.

Therefore, DVD-Audio has the capability to carry a recorded audio signal twice, once as a multichannel signal and again as a two-channel signal. However, carrying the signal twice has adverse implications for playing time. In many cases the original recording is presented as a multichannel signal only, and the two channel listener is given a downmix derived from the multichannel master.

If the recorded audio is carried as conventional Pulse Code Modulation (PCM) samples, the disc may advantageously carry the multichannel recording plus downmix coefficients that allow the player to derive a two channel downmix as a linear combination of the channels of the multichannel signals. For example a downmix consisting of the two channels $L_0$ and $R_0$ could be computed from a multichannel signal containing left-front, right-front, left-surround, right-surround, centre and low-frequency-effects channels, which are denoted $L_f$, $R_f$, $L_s$, $R_s$, $C$ and $L_{fe}$, respectively, using the matrix equation:

$$\begin{bmatrix} L_0 \\ R_0 \end{bmatrix} = \begin{bmatrix} .75 & 0 & .739200 & -.126825 & -.5 & .5 \\ 0 & .75 & -.126825 & .739200 & -.5 & .5 \end{bmatrix} \begin{bmatrix} L_f \\ R_f \\ L_s \\ R_s \\ C \\ L_{fe} \end{bmatrix}$$

The computation of the downmix within the player is however less attractive when lossless compression is used. All six channels of the multichannel signal must be decoded before the above matrix equation could be applied, and the computational overhead of decoding six channels is excessive in this context.

Figure 1:
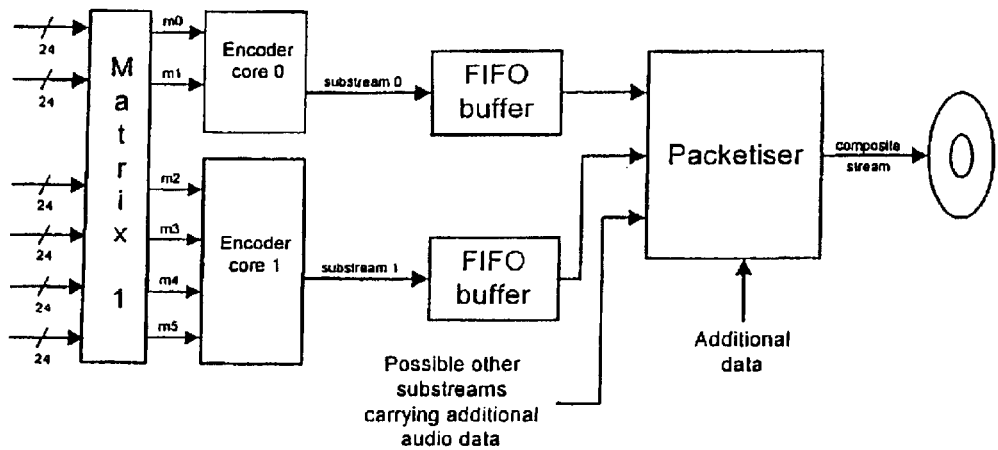
FIG. 1 shows an overview of a lossless six channel encoder comprising a matrix that is used to encode the matrixed channels into two substreams, which are then packaged into a single stream and recorded on DVD.
Figure 2:
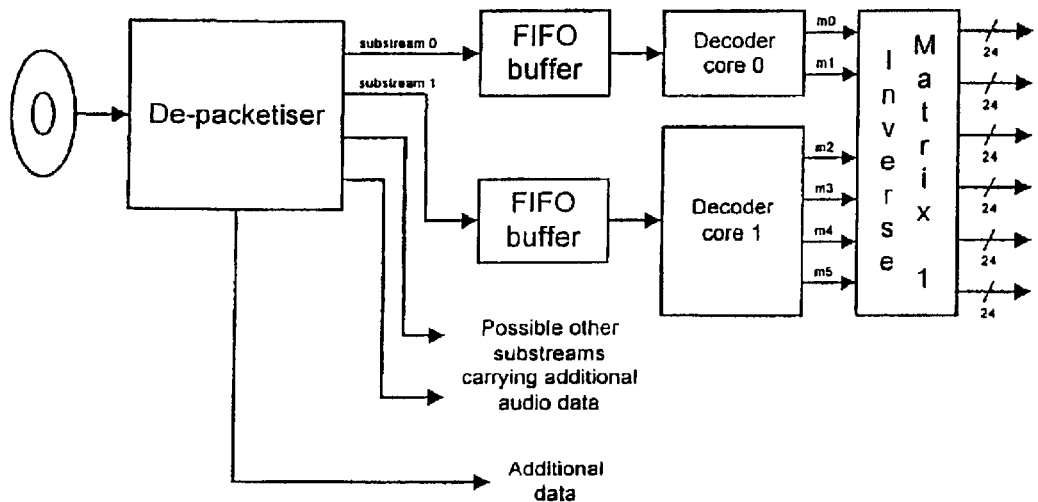
FIG. 2 shows a multichannel decoder decoding the two substreams produced by the encoder of FIG. 1 to furnish a lossless reconstruction of the original six channels.
Figure 3:
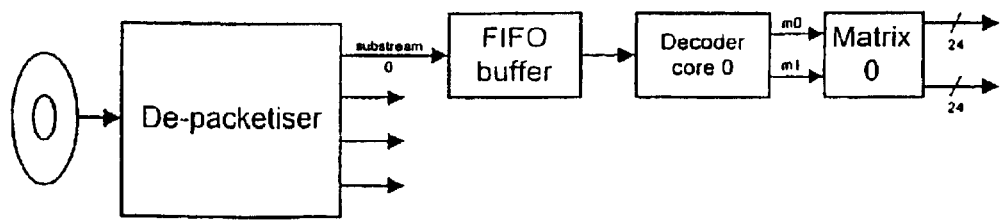
FIG. 3 shows a two-channel decoder decoding the first substream only to furnish a two channel downmix.

An example of a solution to this problem is shown in FIGS. 1, 2 and 3. In FIG. 1, the multichannel signal presented to the encoder is fed to 'Matrix 1', in this case a 6×6 matrix, whose outputs $M_0 \ldots M_5$ are partitioned into the two subsets $\{m_0, m_1\}$ and $\{m_2, m_3, m_4, m_5\}$. These subsets are then encoded by 'Encoder core 0' and 'Encoder core 1' into two separate substreams, designated 'substream 0' and 'substream 1'. Each substream is then fed through a FIFO buffer and the substreams are combined in the 'packetiser' to produce a composite output stream which may be on a medium such as a DVD, as shown in the figure. The reason for using a FIFO buffer is discussed in U.S. Pat. No. 6,023,233, and is illustrated in M. A. Gerzon, P. G. Craven, J. R. Stuart, M. J. Law and R. J. Wilson "The MLP Lossless Compression System" presented at the AES 17th International Conference on High Quality Audio Coding, Florence, Sep. 1998, referred to herein as 'AES 1998'.

To play the multichannel signal encoded by the encoder shown in FIG. 1, a decoder such as that shown in FIG. 2 is used. In this decoder, a 'de-packetiser' receives an encoded stream from a transmission medium or storage medium such as a DVD, as shown, parses the encoded stream and separates it into two substreams. Each substream is passed through a FIFO buffer and a 'decoder core' in order to furnish the signals $m_0 \ldots m_5$. These signals are then passed through the inverse of Matrix 1 in order to furnish the original multichannel signal.

To play a two channel downmix a decoder such as that shown in FIG. 3 is used. Here the substreams are separated but only substream 0 is retained, buffered and decoded to furnish signals $m_0$ and $m_1$. From these the matrix Matrix 0 derives the desired signals $L_0$ and $R_0$, assuming that the encoder has placed the correct information in $m_1$ and $m_1$, for this to be possible. For example, if the top two rows of Matrix 1 in the encoder of FIG. 1 contain downmix coefficients such as those in the 2×6 matrix shown above, the signals $m_0$ and $m_1$ will be the required downmix signals $L_0$ and $R_0$. In this case 'Matrix 0' in FIG. 3 is redundant and can either be replaced by the identity matrix or omitted.

A distinguishing feature of the present invention is that it may be lossless throughout, so that the multichannel output signal obtained from the decoder of FIG. 2 is bit-for-bit identical to the input signal provided to the encoder of FIG. 1. Thus, the encoder and decoder cores, if present, must be lossless, and Matrix 1 and its inverse are also required to be lossless. The lossless encoder and decoder cores may be implemented in essentially any manner that provides for lossless coding but, in preferred embodiments, these processes are implemented according to the processes that are disclosed in WO-A 96/37048. Considerations for implementing Matrix 1 are discussed below in more detail.

This distinguishing feature of lossless coding allows a DVD or other medium to convey an encoded stream in a form that allows lossless recovery of an original multichannel signal and also allows simple recovery of a matrixed representation or downmix of the original signal using essentially the same storage space or bandwidth that would otherwise be required to convey only the original multichannel signal. In practical embodiments, the required storage space or bandwidth of a losslessly compressed signal incorporating a downmix may be very slightly higher than that required by the compressed multichannel signal alone due to the additional information conveyed in the encoded stream that is needed by the decoder to reverse the downmix and due to the fact the PMQs that are used to encode the downmix are not available for use to optimise the coding process.

Figure 4A:
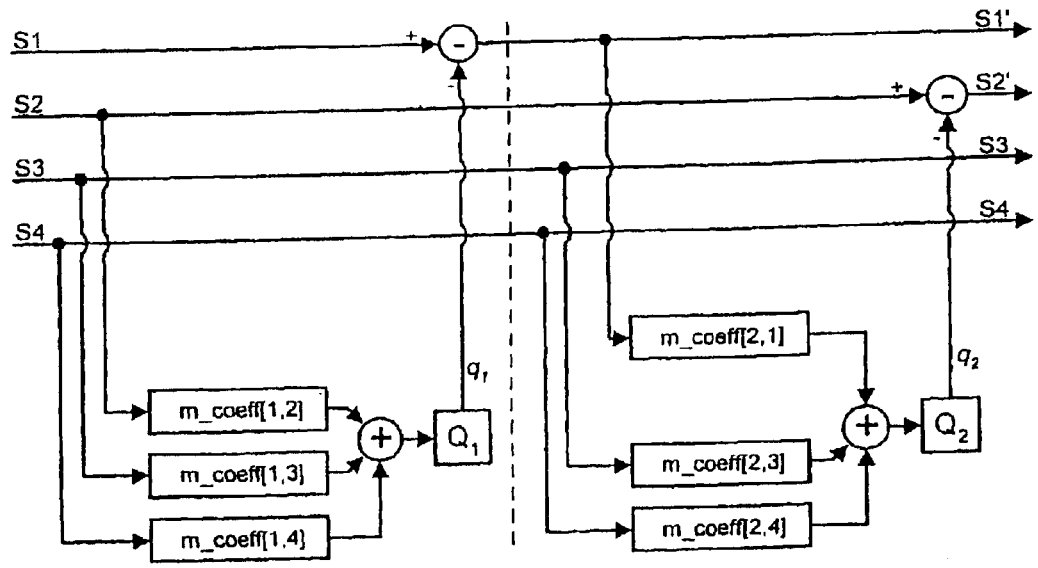
FIG. 4a shows a cascade of two primitive matrix quantisers modifying two channels of a four channel signals.
Figure 4B:
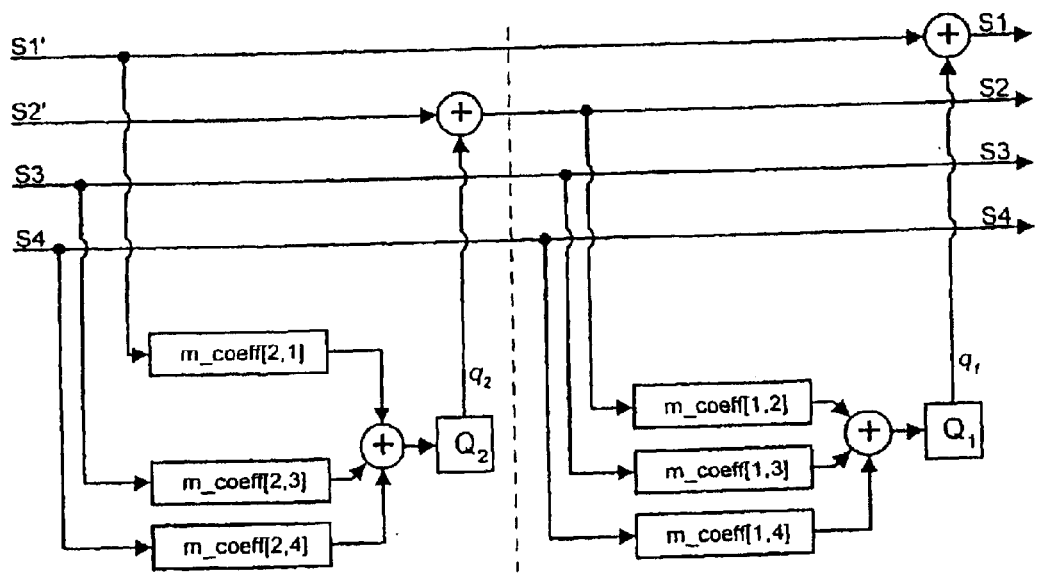

One method of performing the matrixing losslessly is by using a cascade of primitive matrix quantisers (PMQs), which are disclosed as 'primitive matrices' in WO-A 96/37048. These PMQs are matrices that are used to modify the signal in one channel, using signal values obtained from other channels, in a manner that is invertible. In particular, WO-A 96/37048 discloses how lossless inverse matrixing may be performed by inserting the effect of each quantiser in reverse order. This is illustrated in FIG. 4a, showing two PMQs in cascade for use in an encoder, and FIG. 4b showing the two inverse PMQs in reverse order. In simple situations where there are, in particular, only two primitive matrix quantisers, then the signals S1, S2,S3 and S4 can be identified with original channels such as $L_f$, $R_f$, $L_s$, $R_s$, etc., and the modified signals S1' and S2' can be identified with $L_0$ and $R_0$, or with signals $m_0$ and $m_1$.

To verify bit-for-bit reconstruction of the original signal, observe that the quantiser $Q_2$ in FIG. 4b is fed with the same signal as the quantiser $Q_2$ in FIG. 4a. They, being assumed identical, therefore produce the same output $q_2$. In FIG. 4a the signal S2' is formed as S2'=S2−$q_2$, while FIG. 4b performs the restoration S2=S2'+$q_2$. With S2 thus restored, quantiser $Q_1$ in FIG. 4b is fed with the same signal as quantiser $Q_1$, in FIG. 4a, and signal S1 is restored in a manner similar to the manner S2 is restored.

The quantisers $Q_1$, and $Q_2$ are needed in order to prevent the word length of the modified signals S1' and S2' from exceeding that of the input signals S1 and S2,so that the information content is not increased.

FIG. 4 shows just four channels for simplicity, but it will be seen how this principle can be extended to any number of channels and how a larger number of PMQs can be used in cascade. Each PMQ modifies just one audio channel, and in FIG. 4 only the first two channels are modified. In practice, any or all of the channels may be modified, and there is no restriction on order nor any prohibition that a given channel be modified more than once. In the case of a two-channel downmix, it would be normal for at least the first two channels to be modified.

It will be seen that each PMQ in FIG. 4 has a gain of unity to the channel it modifies. It is not possible to synthesise the most general matrix from a cascade of such PMQs: WO-A 96/37048 explains that the set is restricted to matrices having a determinant equal to one. In the general case, it is necessary to scale the downmix equations in order to obtain a determinant that has a unit magnitude. For example, in the case of the downmix equations displayed earlier, they should be scaled by 4/3 so that Matrix 1 in the encoder implements:

$$\begin{bmatrix} m_0 \\ m_1 \end{bmatrix} = \begin{bmatrix} 1.0000 & 0. & .9856 & -.1691 & -.6667 & .6667 \\ 0. & 1.0000 & -.1691 & .9856 & -.6667 & .6667 \end{bmatrix} \begin{bmatrix} L_f \\ R_f \\ L_s \\ R_s \\ C \\ L_{fe} \end{bmatrix}$$

while Matrix 0 in the two-channel decoder implements the inverse scaling:

$$\begin{bmatrix} L_0 \\ R_0 \end{bmatrix} = \begin{bmatrix} .75 & 0 \\ 0 & .75 \end{bmatrix} \begin{bmatrix} m_0 \\ m_1 \end{bmatrix}.$$

Figure 8:
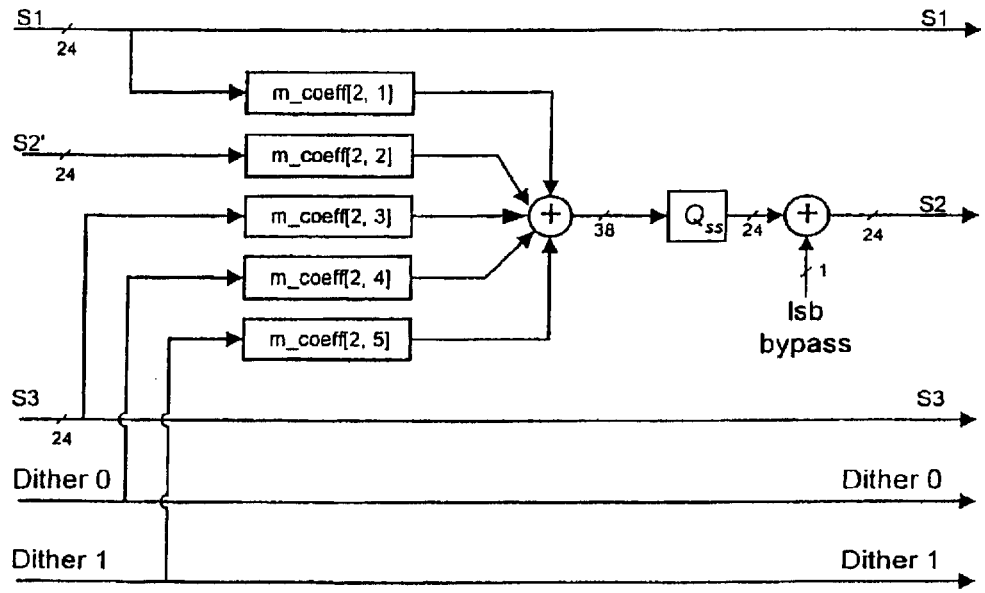
FIG. 8 shows a primitive matrix quantiser that is specified for use in one embodiment of an MLP decoder.

It is evident that Matrix 0 cannot be implemented as a cascade of PMQs because its determinant does not have a unit magnitude. This is not a problem because Matrix 0 is not required to provide lossless reconstruction of an original signal. An architecture that allows a two-channel decoder to implement Matrix 0 as either a strict cascade of PMQs for losslessly decoding a two-channel original signal, or as a more general matrix for downmix applications, is shown in FIG. 8 and described later.

To calculate the coefficients for the PMQs forming Matrix 0, the following procedure may be adopted. Denote by downmix the matrix of downmix coefficients, for example in the case considered above, we have $$\text{downmix} = \begin{bmatrix} .75 & 0 & .739200 & -.126825 & -.5 & .5 \\ 0 & .75 & -.126825 & .739200 & -.5 & .5 \end{bmatrix}$$

Then for $j = 1 \ldots 6$ calculate $$\text{coeff}_{1,j} = \frac{\text{downmix}_{i,j}}{\text{downmix}_{1,1}},$$

then calculate $$\text{coeff}_{2,1} = -\frac{\text{downmix}_{2,1}}{\text{coeff}_{1,2}\text{downmix}_{2,1} - \text{downmix}_{2,2}},$$

and then for $j = 3 \ldots 6$ calculate $$\text{coeff}_{2,j} = -\frac{\text{downmix}_{2,j}}{\text{coeff}_{1,2}\text{downmix}_{2,1} - \text{downmix}_{2,2}} - \text{coeff}_{2,1}\text{coeff}_{i,j}$$

The coefficients m_coeff in FIGS. 4a and 4b for i,j are now given by the expression $$m\_coeff[i, j] = -coeff_{i,j}$$

where the minus sign arises because of the subtraction in FIG. 4a.

In the multichannel decoder of FIG. 2, the Inverse Matrix 1 may be implemented as in FIG. 4b, using the same values m_coeff[i, j] as in the encoder, but with the reversed order of PMQs and with subtraction in each encoding PMQ replaced by an addition as shown. Note that the inputs $m_0 \ldots m_5$ to the cascade of PMQs are derived from two substreams in this case.

Although the invention as so far described is particularly relevant in the context of compression, it is applicable generally and not restricted to compression systems. Also, the principle described above is not restricted to two substreams. For example, using three substreams a nine-channel signal can be conveyed losslessly, with the information required to decode a six-channel downmix carried in the first two substreams, and the information required to decode a two channel downmix (as a linear combination of the six channels) carried in only the first substream.

In current commercial applications, the matrix defining the downmix signals $L_0$, $R_0$, in terms of $L_f$, $R_f$, $L_s$, $R_s$, C and $L_{fe}$ will generally have the largest coefficients multiplying $L_f$ and $R_f$, as is the case in the example above. However, this situation cannot be guaranteed because the dominant coefficients may multiply some of the other signals. If the coefficients of $L_f$ and $R_f$ are indeed small, the requirement that a PMQ have unity gain to the channel that it modifies introduces a problem because one or more other channels should be scaled up accordingly. If simple scaling as shown above is used to address this problem, other coefficients of the matrix will exceed unity and, as a result, overload or other problems may occur.

This problem may be addressed by a permutation of the channels in the encoder so that for example a 'first' channel whose coefficient in $L_0$ is largest could be brought to the beginning of the sequence and a 'second' channel whose coefficient in $R_0$ is largest is brought to second place. In this example, it is assumed the first and second channels are not the same. This re-ordering usually makes it possible for the encoder to furnish matrixed signals $m_0$ and $m_1$ that are proportional to $L_0$ and $R_0$ by using two PMQs whose coefficients do not substantially exceed unity to modify the first two channels.

With such a permutation in the encoder, the multichannel decoder of FIG. 2 will require an inverse permutation in order to reproduce the signals in the correct order. Re-mapping of the output channels is provided in an MLP decoder, as instructed by the ch_assign information in the encoded stream. In the case that the encoder uses a permutation, it may instruct the decoder to apply the inverse permutation by specifying the appropriate re-mapping.

The inverse permutation is applied after the decoder's matrixing if the encoder applies a permutation before matrixing. Another possibility would be to apply the permutation in the decoder before the matrixing if permutation is applied in the encoder after matrixing. Additionally, it would be possible for a decoder of an MLP stream to apply the permutation before the matrixing if the coefficients of the matrix are also permuted.

There are certain unlikely but possible downmix specifications that the strategies outlined above will not handle. One possibility is that $L_0$ and $R_0$ may have coefficients that are the same or nearly the same or, in other words the downmix is mono or nearly mono. In this situation the above procedure is unsatisfactory because the denominator of the expression for $coeff_{2,1}$ becomes zero or nearly zero, resulting in large coefficients and a high probability of overload. This problem can be solved by choosing $m_0$ and $m_1$ differently. Regarding the signals as elements of a vector space, the signals $L_0$ and $R_0$ will in general span a two-dimensional subspace of the 6-dimensional Euclidean vector space, or in general an n-dimensional Euclidean vector space, of which the channels of the multichannel signal form an orthonormal basis. The signals $m_0$ and $m_1$ must span this, subspace if $L_0$ and $R_0$ are to be reconstructed. It is reasonable to choose $m_0$ and $m_1$ to be orthogonal or approximately orthogonal to each other in the subspace spanned by $L_0$ and $R_0$. Having determined $m_0$ in terms of the input channels, these channels may be permuted prior to the matrix so that a channel whose coefficient in $m_0$ is largest, or substantially largest comes first. A PMQ is then computed as above so that the first transmitted channel is a scaled version of the desired $m_0$. It is then necessary to compute a PMQ to furnish a scaled version of $m_1$. Once again a prior permutation may be desirable in order to minimise the magnitude of coefficients. This permutation of the signals to be matrixed is akin to the process of 'partial pivoting' known to those skilled in the art of matrix computations, and will not be described further here. Initially, $m_0$ and $m_1$ may be given arbitrary scaling. Then the above procedure for coefficient determination may then be used by replacing the matrix downmix with the matrix giving $m_0$ and $m_1$ in terms of the original channels. The coefficients determined by this procedure will then determine the actual scaling of $m_0$ and $m_1$.

In the degenerate case where $L_0$ and $R_0$ are identical signals or are scaled versions of each other, the subspace spanned by $L_0$ and $R_0$ will be one-dimensional. In this case $m_0$, may be chosen arbitrarily within the subspace and $m_1$ may be chosen to be orthogonal to $m_0$ but from outside the subspace. Matrix 0 in a two-channel decoder will then reconstitute $L_0$ and $R_0$ as a scaled version of $m_0$ and will ignore $m_1$.

In the MLP lossless compression system, the coefficients of Matrix 0 are carried in the first substream, Substream 0, and the coefficients of Matrix 1 are carried entirely in the second substream, Substream 1, even though some of these coefficients are used to multiply signals decoded from the first substream.

Downmix Encoding Combined With Data Rate Reduction

Lossless encoders using matrixing are discussed extensively in WO-A 96/37048, where the purpose of the matrixing is to reduce the correlation between the transmitted channels and thereby to reduce the transmitted data rate. In the case where a downmix is to be encoded as described above, the matrixing is partially specified by the downmix requirement, but considerable freedom in the specification remains.

Firstly, in choosing $m_0$ and $m_1$, the condition that they be approximately orthogonal still allows an arbitrary rotation within the subspace spanned by $L_0$ and $R_1$. This freedom may be used to minimise the data rate required to encode the first substream, Substream 0, for example using the methods discussed in WO-A 96/37048 that minimise the data rate taken by any signal of two or more channels.

Secondly, assuming for example a 6-channel multichannel signal, the matrixing of the four channels that are not modified to furnish the downmix is still completely unspecified. Once again, the methods described in WO-A 96/37048 may be used to minimise the data rate required to encode the second substream, Substream 1. In the case of a PMQ implementation, two PMQs may be used to derive the downmix, and any remaining PMQs may be used minimise the data rate of the remaining four channels in the same way as for any other four channel signal. In the MLP compression system, six PMQs are available in total, allowing four to be allocated to this task.

Dither

It is now regarded as extremely important in audiophile circles that any quantisation that affects the reproduction of the audio signal be performed using dither. Typically, a small pseudo-random dither value is added to the signal before it is passed to the quantiser. See for example S. P. Lipshitz, R. A. Wannamaker, and J. Vanderkooy, "Quantization and Dither: A Theoretical Survey," J. Audio Eng. Soc., May 1992, vol. 40, pp. 355–375.

The primitive matrix quantisers inherently perform quantisation. In the case of lossless encoding and decoding, the absence of dither is not a problem because the lossless matrixing in the decoder inverts exactly the matrixing performed in the encoder, including any quantisation effects. However in furnishing a downmix as described above, Matrix 0 does not invert the effect of Matrix 1, and the downmix will contain quantisation effects from both matrices.

In order to render the downmix quantisation benign, dither must be added by both matrices. However, adding dither in the encoder's Matrix 1 will affect the transmitted signal, and the decoding of the multichannel signal will be affected thereby. Therefore for lossless decoding, the Inverse Matrix 1 in the multichannel decoder must compensate for the effect of the dither in the encode matrixing.

Figure 5A:
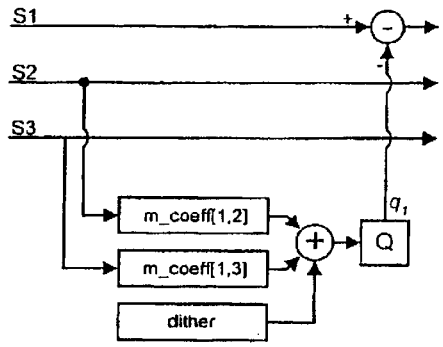
FIG. 5a shows a primitive matrix quantiser incorporating dither.
Figure 5B:
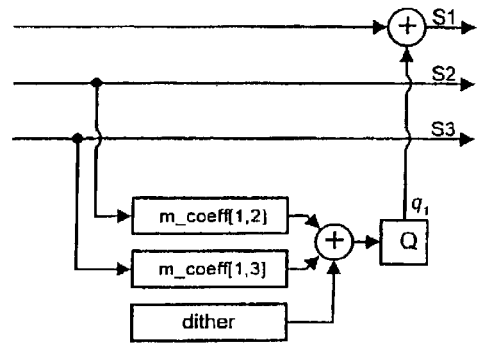
FIG. 5b shows an inverse primitive matrix quantiser incorporating dither.

FIG. 5a and 5b show a complementary pair of primitive matrix quantisers including dither, in this case for a three channel signal. The two matrix quantisers differ only in that the signal $q_1$ is subtracted in the quantiser shown in FIG. 5a, whereas the same signal is added in the quantiser shown in FIG. 5b. It is easily seen that, provided the signal furnished by the box marked 'dither' is the same in both cases, the PMQ in FIG. 5b will undo the action of the PMQ in FIG. 5a. Thus, an encoder as shown in FIG. 1 can be constructed in which 'Matrix 1' is a cascade of PMQs as shown in FIG. 5a, and the multichannel decoder of FIG. 2 can be constructed in which 'Inverse Matrix 1' is a reversed-ordered cascade of PMQs as shown in FIG. 5b. This will ensure that the multichannel signal is reconstructed losslessly.

For the best quality downmix reproduction, the conventional requirements for dither should be satisfied both in the encoder's 'Matrix 1' and in the decoder's 'Matrix 0'. Thus for example in the encoder, the dither generator in FIGS. 5a and 5b could advantageously furnish TPDF dither with a peak-to-peak amplitude equal to two quantisation steps of the quantiser Q. If the first two PMQs in the encoder furnish the downmix signal, then it is not necessary to add dither to the later PMQs.

Matrix 0 may be a different type of matrix, but it will nevertheless include computation, which increases the word length, followed by quantisation, and it is normal to add dither before each quantisation.

The requirement for identical dither in the encoding and decoding quantisers of FIGS. 5a and 5b can be met by the encoder recording a 'seed' conveying the state of a pseudo-random sequence generator within the stream from time to time, and the decoder reading the seed and thereby synchronising its own sequence generator.

In MLP the sequence generator is a 23-bit circular shift register generating a pseudorandom:binary sequence (PRBS) using the expression:

$$b_{23} \oplus b_5 \oplus 1$$

where $b_x$ represents bit x of the shift register, and $\oplus$ represents the exclusive-OR operation.

Thus the seed in the stream is 23 bits long. The shift register is shifted by 16 bits on each sample period. This allows a new 16-bit pseudo-random number with a rectangular PDF to be generated for each signal sample. However, because TPDF dither is preferred, the 16 bits are divided into two 8-bit dither samples. These 8-bit samples each have a rectangular PDF, but the encoder has the option to add and subtract these two samples to furnish two further uncorrelated dither samples having a triangular PDF. This process is known as 'Diamond Dither' and is explained in the above-cited Wannamaker reference, AES preprint no. 4533. The encoder can use these two triangular PDF samples to add dither to two PMQs that furnish the downmix signal.

Audiophile considerations do not require that the dither applied in Matrix 0 to recover the downmix signal be synchronised to a corresponding process in the encoder. Indeed it is undesirable that the same dither be applied, or that Matrix 0 apply any dither that is correlated with the dither applied in Matrix 1. In MLP the downmix decoder generates a dither signal using same algorithm as the multichannel decoder, but the dither is different because the seed is different: the seed for the Matrix 0 dither is carried in Substream 0, while the seed for the Matrix 1 dither is carried in substream 1.

In MLP, the quantisation and arithmetic of Matrix 0 are specified just as precisely as for Matrix 1, and with the dither also controlled by the encoder, the encoder has precise knowledge of the $L_0$ and $R_0$ signals recovered by the decoder, down to the last bit. We shall return to this point later.

Saturation of Downmix

It is often considered commercially important to encode an audio signal at the maximum level that the digital channel can handle. Peaks in live music can be very 'uncontrolled' and the average level must be kept well below digital clipping if no peak of a live signal is to cause overload. However, the professional recording engineer is well equipped with tools for waveform modification, such as clippers and limiters, that allow him to produce a 'controlled' signal that modulates a channel very fully while ensuring that no peak will overload.

It will be understood that digital overload can result in extremely unpleasant artifacts caused by 'wrap-round' effects. For example, in conventional twos-complement 24-bit audio, the maximum positive value is represented by 7 f f f f f hexadecimal. A naïve attempt to increase this value by one quantisation level will result in 800000 hexadecimal, which is interpreted as the maximum negative excursion. Thus small overloads can generate full-scale transitions having a large high-frequency energy content, which sounds extremely unpleasant and frequently causes burn-out of tweeters.

In the context of DVD mastering, it is assumed that a 'controlled' multichannel master is produced and presented for lossless encoding. In other words, it is assumed that any overload problems in producing the multichannel signal have already been dealt with. The task remains to produce an acceptable $L_0 R_0$ downmix.

Overload at the output of the two-channel decoder of FIG. 3 can be avoided by scaling down the coefficients of 'Matrix 0' sufficiently. However such scaling down has two problems. Firstly the amount of scaling required is not known until the entire programme material has been examined, which is inconvenient at the mastering stage. Secondly, such scaling is likely to result in a downmix that is unacceptably quiet by commercial standards. This is because any prior clipping or limiting of the multichannel signal is not necessarily effective in constraining the peak-to-mean ratio of a downmix derived from the multichannel signal.

It is not possible to adjust the downmix at the encoding stage, because this would alter the transmission of $m_0$ and $m_1$, and recovery of the multichannel signal would then not be lossless.

Accordingly, the invention provides for a downmix decoder to have the ability to generate internally a downmix signal having an amplitude larger than a digital output can handle, and to incorporate a limiter or clipper prior to the final output so that overload of the downmix signal is handled without unpleasant effects.

In MLP, the output word width is specified as 24 bits, and most of the internal signal paths, including the paths between the PMQs, are also specified as 24 bits wide. However, after the last PMQ in the decoder, a shifter is provided that shifts left or right by a variable number of bits specified by "output shift" information carried from time to time in the encoded stream. If the encoder is given an input and a downmix specification that result in a downmix requiring more than 24 bits, the encoder scales down the downmix specification to avoid overload within the matrixing. This scaling down is by a power-of-two, so that the correct amplitude can be restored in the decoder by specifying a positive left shift in the "output shift" information. The shifter in the decoder thus generates a downmix signal of the correct amplitude, which may be too large for the 24-bit output. Therefore a clipper is placed between the shifter and the output, in order to avoid the undesirable 'wrap-round' effect discussed earlier. The clipper may conveniently be implemented using the facility provided in many DSP chips whereby a value in an accumulator may be stored to memory using 'saturation arithmetic'.

An additional synergy arises in this case if the memory location to which the accumulator is stored can be calculated in dependence on the "ch_assign" information in the stream. This accomplishes the inverse permutation of channels required in a decoder without having to implement it as a separate operation.

LSB Bypass

If an input signal exercises the full 24-bit range, then an attempt to modify a channel using a PMQ according to FIG. 4 or 5 is likely to lead to a signal that exceeds the 24-bit range. This increased range, which is internal to the lossless encoding and decoding process, can be accommodated economically even on a processor using 24-bit arithmetic by using the architecture of FIG. 6.

Figure 6A:
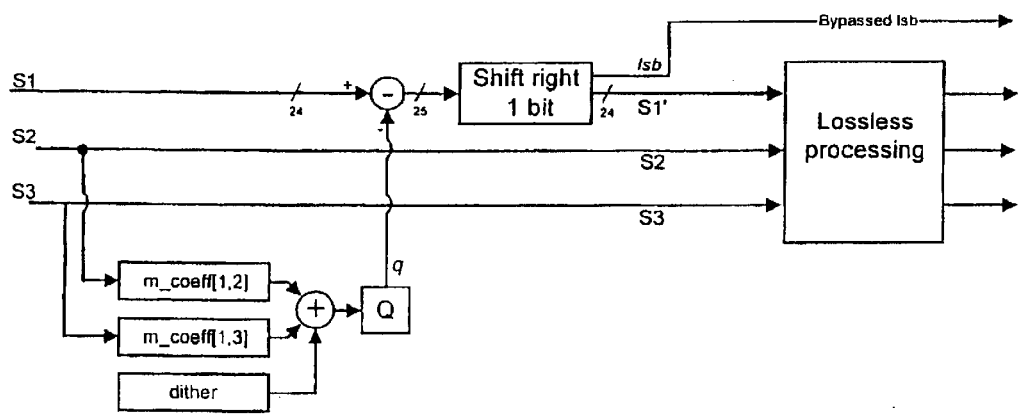
FIG. 6a shows a primitive matrix quantiser modified to provide the 'LSB bypass' facility, and the separate transmission of the bypassed in the case of any further lossless processing.

FIG. 6a shows, on the left, a PMQ that incorporates a shifter. The signal paths are assumed to be 24 bits wide generally, but after the subtraction of the quantised signal q from S1 a 25-bit data path is provided to allow headroom for the addition. The signal is then shifted right arithmetically by one bit and the LSB shifted from the bottom of the word is output separately from the main output S1', which contains the remaining 24 high-order bits.

The LSB thus shifted out must of course be carried with the signal. To decode the signals S1, S2 and S3, the LSB together with signals S1', S2 and S3 should be presented to the inverse PMQ shown on the right of FIG. 6b. Here the LSB is appended to S1' and the result is shifted left by one bit so that the separately carried LSB is the LSB of the shifted word, thereby giving a 25-bit signal to which the quantised signal q is added. The result of this addition is only 24 bits wide by virtue of lossless reconstruction of the signal S1 fed as input to the PMQ shown in FIG. 6a, provided that S1 is a 24 bit signal.

Figure 6B:
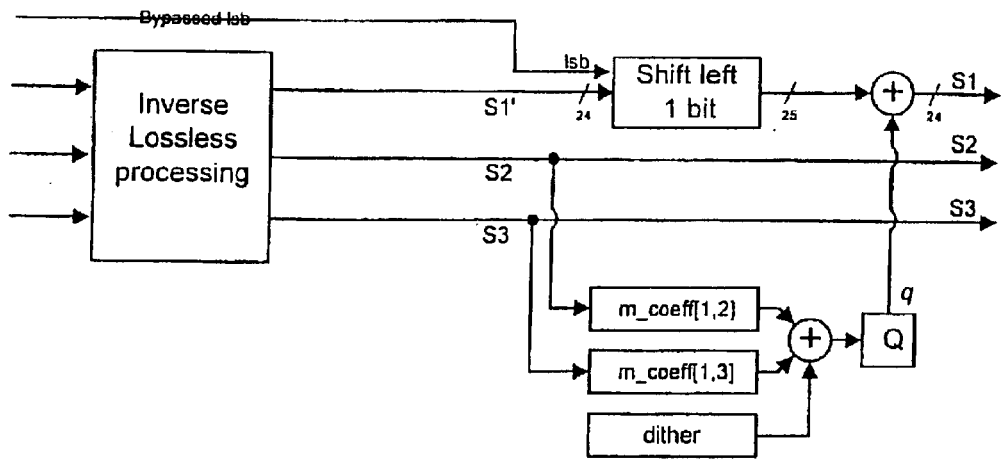
FIG. 6b is complementary to FIG. 6a, showing the separate transmission of the bypassed LSB in the case of any inverse lossless processing, and a primitive matrix quantiser that integrates the bypassed LSB and reconstitutes the original signal.
Figure 7A:
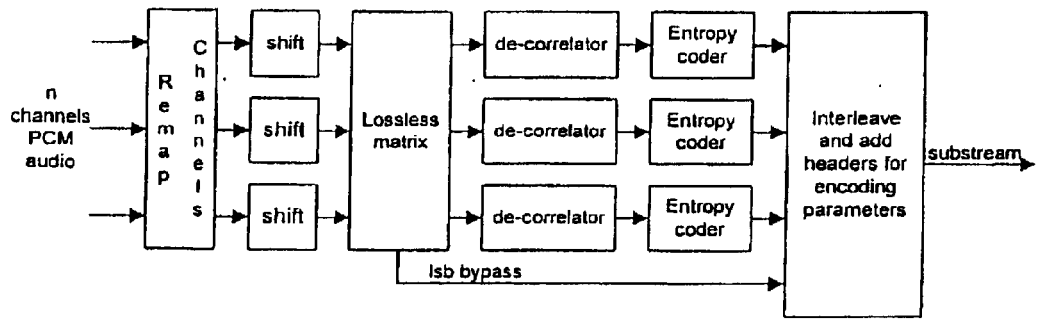
FIG. 7a shows a block diagram of part of one embodiment of an MLP encoder with LSB bypass.
Figure 7B:
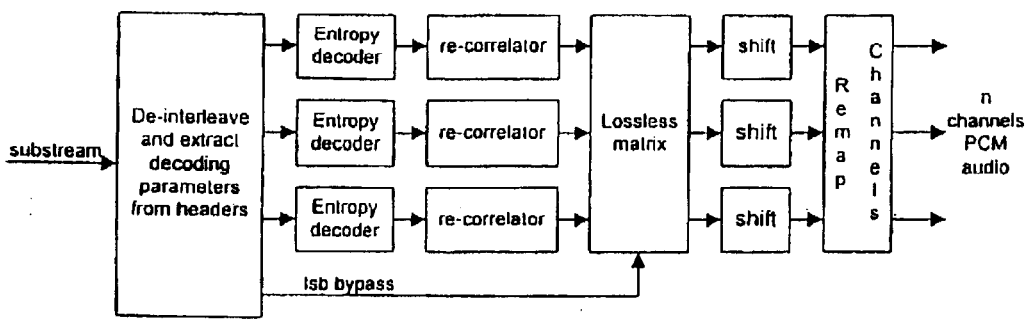

As shown on the right of FIG. 6a and on the left of FIG. 6b, it is possible to insert further lossless processing and inverse lossless processing of the 24-bit wide path between the two complementary PMQs, provided there is a bypass path so that the LSB is conveyed separately. For example, a partial block diagram of an MLP encoder is shown in FIG. 7a and the corresponding decoder is shown in FIG. 7b. A decorrelator and an entropy coder comes after the matrix shown in FIG. 7a; thus, in this example, the 'Lossless processing' shown in FIG. 6a would include these items. Similarly, referring to FIG. 7b, the 'Inverse Lossless Processing' shown in FIG. 6b could include an entropy decoder and a recorrelator. As shown in FIGS. 7a and 7b, care is taken to preserve the bypassed LSB across this processing, to store it to and recover it from the encoded stream or substream.

Sometimes the matrixing in MLP does not cause overload, but the decorrelator, while designed generally to reduce the signal amplitude, increases it on particular samples and thereby encounters an overload problem. In this case a PMQ of the type shown in FIG. 6a may be used to reduce the amplitude of the signal and thus provide approximately 6 dB of headroom for further processing. The coefficients shown in FIG. 6 may be set to zero when a PMQ is used for this purpose only.

It will be clear that the scheme of FIG. 6a could be generalised to allow more than one bit to be shifted out from a PMQ and transmitted as a bypass signal. This is not done in MLP.

The processing shown in FIG. 6a is lossless, and the corresponding inverse lossless processing shown in FIG. 6b is also lossless. Thus it is possible to nest this processing. For example, the 'Lossless Processing' shown on the right of FIG. 6a could include a PMQ of the sort shown on the left of FIG. 6a, and the coding effect of this nested PMQ could be inverted by including in the 'Inverse Lossless Processing' shown on the left of FIG. 6b a PMQ of the sort shown on the right of FIG. 6b. In this case a bypassed LSB will be generated at each stage, so two bypassed LSBs must be carried round any further processing.

In an MLP encoder there are up to six PMQs in cascade, and any or all of them may be configured to provide a bypassed LSB. Thus the substream may carry up to six bypassed LSBs, one from each PMQ. Although each bypassed LSB comes from a different PMQ, there is no requirement that they come from different channels, and the encoder may occasionally choose to allocate two or more such PMQs to one channel and thus obtain an additional 12 dB or more of headroom for that channel.

There are variants of the topology shown in FIGS. 6a and 6b that have an equivalent effect. The subtraction of the signal q in FIG. 6a and the addition of the signal q in 6b could be interchanged. Subtraction can be avoided by inverting the sign of the coefficients, by inverting the sign of the dither if used, and if necessary by making an adjustment to the quantiser Q, for example by replacing a quantiser that rounds down by a quantiser that rounds up. Another variation is to place the quantiser Q in the forward path, as shown in FIG. 23a of WO-A 96/37048, instead of in the side-chain, again taking care in choosing quantisers that round up or down. In FIG. 6b the shifting of the S1' signal and the LSB together may instead be implemented as a left shift of the S1' signal. Thereby producing a zero LSB, and then adding the separately transmitted LSB. In this case the addition of the separately transmitted LSB may be combined with, or performed after, the addition of the quantised signal q. In embodiments for MLP, the addition should produce a 24-bit number.

FIG. 8 shows the decoder PMQ specified for MLP, as configured to recover three channels S1, S2 and S3, with the second channel S2 being modified. This incorporates some of the variations discussed above and in addition uses a general multiplication to implement the left shift. The encoder specifies the coefficient values and includes them in the stream. Thus, to shift the signal S2' left by one bit the encoder could set the coefficient m_coeff[2, 2] equal to +2. MLP uses 16-bit coefficients in the range [−2, +2); therefore the exact value +2 is not available and the encoder specifies −2 instead. Thus the decoding PMQ inverts the signal in this case and the encoder must also invert the signal to compensate.

As discussed previously, it is advantageous to have two uncorrelated RPDF dither signals in order to furnish two TPDF dither signals by addition and subtraction. In the MLP matrixing, the two 8-bit RPDF dither signals obtained from the sequence generator are sign-extended to 24 bits and treated as if they were two extra channels. These dither channels are never modified by PMQs. It will be seen that the dither in FIG. 8 is given by:

$$m\_coeff[2, 4] \, Dither0 + m\_coeff[2, 5] \, Dither1$$

This dither is like the dither identified as dither in FIG. 6b. If m_coeff[2, 4] and m_coeff[2, 5] have the same magnitude, dither will have the desired triangular PDF. Thus, if two PMQs are used to furnish a downmix, the encoder will specify m_coeff[2, 4] and m_coeff[2, 5] with the same sign in one PMQ and opposite signs in the other PMQ, thus furnishing uncorrelated TPDF dither signals by the 'Diamond Dither' method discussed above.

In FIG. 8 if we regard the input signal samples as 24-bit integers, then the output values from the multipliers will in general have 14 bits after the binary point because the coefficients m_coeff[2, j] may have up to 14 bits after the binary point. We assume for the moment that the quantiser $Q_{ss}$ quantises to a 24-bit integer value. In this case, if the two 8-bit RPDF dither values are right-justified in the 24-bit words Dither0 and Dither1, then the correct magnitudes for m_coeff[2, 4] and m_coeff[2, 5] are $2^{-8}$.

If additional PMQs are used to reduce the bit rate of the stream without affecting the downmix signals, it will be normal in the encoder not to use dither, hence the m_coeff[i, j] values used to multiply the dither channels in the PMQs will be zero. This suggests that an economy could be made by not including the dither capability in all PMQs. This economy is not made in MLP implementations, however, because the advantages realized from the regularity of the structure in practical embodiments far outweighs the cost of an additional pair of multiplications.

In MLP, cascaded PMQs according to FIG. 8 are used both for Matrix 0 and Matrix 1. In the case of Matrix 1, it would be normal for the coefficient of the channel being modified, which is m_coeff[2, 2] in the case illustrated, to have the value −2 when the LSB bypass is used, and either +1 or −1 when the LSB bypass is not used. This choice is made by the encoder and the coefficient is included in the stream for use by the decoder.

When using the 2-channel decoder to reproduce a downmix, Matrix 0 provides the matrixing and/or scaling of the $m_0$ and $m_1$ signals to provide $L_0$ and $R_0$. General coefficients, not restricted to powers of two, are then required in the PMQs. Again regularity in the decoder and flexibility for the encoder are reasons for adopting the architecture of FIG. 8 uniformly.

In Matrix 0, scaling of the modified channel can be accomplished by scaling all the coefficients, except the dither coefficients, that contribute to it. If scaling up is required, there is a possibility that the required scaling will exceed the available coefficient range of [−2, 2), or that signal overload will occur within the matrixing. This can be dealt with by reducing the scaling by a power of 2, then using the final "output_shift" to restore the desired level.

In MLP with downmix, it is not normal to carry the bypassed LSBs in the first substream, Substream 0, since the downmix decoder does not attempt lossless reproduction. The second substream, Substream 1 carries all the information required for the multichannel decoder's matrixing, including the coefficients, the dither seed, and the bypassed LSBs including those LSBs that were dropped from channels that are carried in substream 0.

One feature of FIG. 8 that does not affect the above discussion is that the quantiser $Q_{ss}$ is able to quantise to a step-size that is a power of 2, thus putting the truncation point one or more bits above the LSB. This facility is included in order to optimise the treatment of input signals that do not exercise the least significant bit(s) of the 24-bit word. In MLP, the LSB bypass feature is used only when the quantisation step size is set to unity.

Stream Integrity and 'Lossless Check'

A lossy coding system generally furnishes an output that is not an exact reconstruction of the input signal. Integrity checking, for example a cyclic redundancy check (CRC) or a parity check, should be restricted to a check of the encoded stream so that transmission errors may be flagged. The relationship between the input signal and its final reconstruction is somewhat unknown, being affected both by inherent losses in the lossy encoding and decoding process, and by platform-related errors caused by the arithmetic behaviour of the decoding processor possibly being different from that of the encoding processor.

In MLP, a parity word known as a 'Lossless Check' value, is computed for each segment of the input signal, and included in the encoded stream. It is expected that a decoder will compute a similar parity word and indicate an error has occurred if this computed word does not match the word included in the stream. Unlike the checks that are possible in a lossy coding system, the checks made in a lossless coding system are able to show failures due to overload or other algorithmic failures within the algorithm, platform-related inconsistencies and transmission errors.

In preferred embodiments, a player is able to inform the user of such errors: for example a "Lossless" light could be illuminated when the two check words agree and be extinguished otherwise. Since failure could be momentary, a pulse-stretching circuit may be used so that the user has time to recognize the failure, for example the light could be extinguished for two seconds on receipt of a single failure.

In MLP the Lossless Check value is an 8-bit parity word that is computed for all channels and all samples within a segment of, typically, 1280 words. In terms of the MLP specification, this segment includes all samples between two consecutive 'Restart points'. As MLP assumes 24-bit words, the parity would naturally be computed as a 24-bit word, but this parity word is divided into three octets or bytes and these are exclusively-ORed together in order to furnish the Lossless Check value. Before computing the parity, each 24-bit signal word is rotated by a number of bits equal to its channel number. This rotation avoids a problem where an error that affects two channels identically would otherwise not be detected.

An alternative implementation is to take the parity of all the octets within each segment of each channel to produce an 8-bit parity octet, and rotate each parity octet by its channel number before exclusively-ORing them together. This may be more economical on processors not having a 24-bit word length.

In MLP with a single substream, the Lossless Check value relates to the original signal that is being losslessly reproduced. When MLP is carrying a downmix, the second substream carries the Lossless Check value relating to the original signal, and this will be checked by a multichannel decoder.

In this downmix case the first substream also carries a Lossless Check value, but this relates only to the downmix. Although the downmix output is not a lossless reproduction of an original signal, it is determinable by virtue of the precise specification of the quantisations in Matrix 0 and the precise specification of the dither. Therefore, the encoder can determine the downmix that will be reproduced by a decoder, and can compute the 'lossless check' value from this simulated downmix. In the context of DVD-Audio mastering, it is intended that the encoder should make the simulated downmix available for auditioning, therefore the listener can be assured that the signal recovered in his player is bit-for-bit identical to the signal heard by the mastering engineer or the recording producer.

An exception arises in the case of overload, which as described above is normally handled by clipping or limiting in the player. Because the behaviour of the clipping or limiting is not precisely defined, the Lossless Check value is computed from the signal immediately prior to any saturation or limiting. In MLP, where as explained above the decoder incorporates a shifter after the final PMQ, and may implement clipping by storing an accumulator to memory using saturation arithmetic, the Lossless Check may be computed directly from the value in the accumulator, which is thereby not affected by the saturation.

Figure 9:
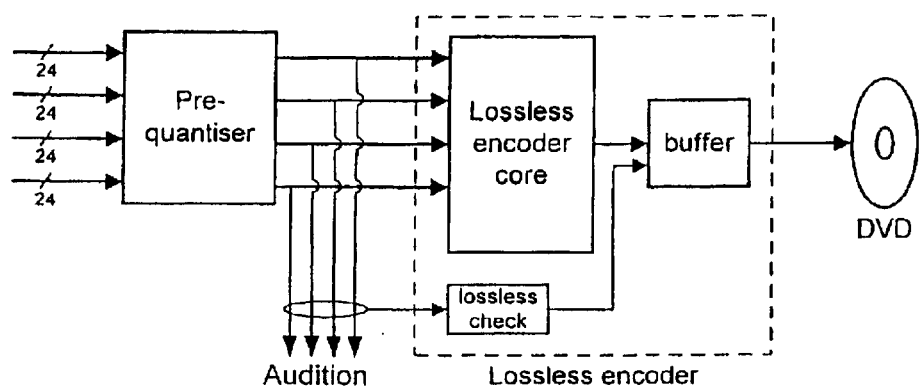
FIG. 9 shows a lossless encoder preceded by a prequantiser with an output for audition, and a 'Lossless Check' value computed from the prequantised output.

Sometimes, as shown in FIG. 9, a lossless encoder may be preceded by a prequantiser in order to reduce the transmitted data rate. Additional information pertaining to prequantisation may be obtained from the AES 1997 and AES 1998 references cited above. In these situations, the reproduction of the original signal received by the prequantiser will not be lossless but the reproduction of the prequantised signal will be lossless. Again, the prequantised signal should be made available for auditioning and the Lossless Check value should be computed from the prequantised signal so that the listener can be assured that the signal recovered in his player is bit-for-bit identical to the signal that w as auditioned or at least was available for audition, at the mastering stage.

Encode Matrix Choice Strategies

To encode a two-channel downmix, the signals $m_0$ and $m_1$ must be in the subspace spanned by the downmix channels $L_0$ and $R_0$. There is considerable flexibility within this criterion, but some choices are better than others. The encoder should avoid choosing $m_0$ and $m_1$ to be nearly linearly dependent for several reasons. Firstly, the matrix Matrix 0 would then probably have large coefficients and the recovery of the downmix would be noisy. Secondly, in solving the equations to determine the PMQs comprised in Matrix 1 the encoder would probably generate coefficients larger than the admissible range. Thirdly, matrixing of the signals affects the data rate for lossless compression, and it is inefficient to transmit separately signals that are very similar to each other.

As noted previously, one way to avoid the worst of these problems is to choose $m_0$ and $m_1$ to be orthogonal to each other. That is, $m_0$ and $m_1$ are defined in terms of the input signals by a matrix whose rows are orthogonal to each other. This criterion still leaves some flexibility, which could be resolved for example by taking $m_0$ proportional to $L_0$. Consider for example the downmix specification:

$$\begin{bmatrix} L_0 \\ R_0 \end{bmatrix} = \begin{bmatrix} .75 & 0 & .75 & -.126825 & -.5 & .5 \\ 0 & .75 & -.126825 & .8 & -.5 & .5 \end{bmatrix} \begin{bmatrix} L_f \\ R_f \\ L_s \\ R_s \\ C \\ L_{fe} \end{bmatrix}.$$

Here the largest coefficient contributing to $L_0$ is that of $L_f$, which has a value equal to 0.75. Therefore, if we generate $m_0$ equal to $L_0$ scaled by $1/0.75 = 1.333$, we have:

$$m_0 = [1.0000, 0., 1.0000, -.1691, -.6667, .6667] \begin{bmatrix} L_f \\ R_f \\ L_s \\ R_s \\ C \\ L_{fe} \end{bmatrix},$$

which can be implemented by a PMQ that leaves the first channel unmodified.

Signal $m_1$ must be a linear combination of $L_0$ and $R_0$. A linear combination that is orthogonal to $L_0$ and hence also orthogonal to $m_0$ is given by $$m_1 \text{ (unscaled)} = R_0 - \lambda L_0,$$

where $$\lambda = \frac{R_o \cdot L_o}{L_o \cdot L_o}$$

and the symbol denotes the scalar or dot product of two vectors.

The resulting value is equivalent to taking the dot products of the row vectors in the downmix matrix. If we use downmix to denote the downmix matrix, then the scalar $\lambda$ may be expressed as $$\lambda = \frac{downmix_2 \cdot downmix_1}{downmix_1 \cdot downmix_1}$$

where $downmix_1$ denotes the first row vector of the matrix; $downmix_2$ denotes the second row vector of the matrix; and Using the downmix matrix from the example shown above, $\lambda=0.1849$. Thus:

$$m_1(\text{unscaled}) = [-.1387, .7500, -.2655, .8234, -.4076, .4076] \begin{bmatrix} L_f \\ R_f \\ L_s \\ R_s \\ C \\ L_{fe} \end{bmatrix}.$$

The second PMQ that will generate $m_1$, receives the signals furnished by the first PMQ, the first channel of which is $m_0$ rather than $L_0$. Therefore $m_1$ must be re-expressed in terms of $m_0$, $R_0$ etc.:

$$m_1(\text{unscaled}) = [-.1387, .7500, -.1268, .8000, -.5000, .5000] \begin{bmatrix} m_0 \\ R_f \\ L_s \\ R_s \\ C \\ L_{fe} \end{bmatrix}.$$

Here the largest coefficient, 0.8000, multiplies $R_s$, the fourth input channel. Therefore we apply a permutation, as discussed previously, to swap the second and fourth input channels and thus bring $R_s$ to the second position so that $m_1$ will appear in the second position in the matrix output:

$$m_1(\text{unscaled}) = [-.1387, .8000, -.1268, .7500, -.5000, .5000] \begin{bmatrix} m_0 \\ R_s \\ L_s \\ R_f \\ C \\ L_{fe} \end{bmatrix}.$$

Finally we scale so that the coefficient of $R_s$ is unity:

$$m_1 = [-.1733, 1.0000, -.1585, .9375, -.6250, .6250] \begin{bmatrix} m_0 \\ R_s \\ L_s \\ R_f \\ C \\ L_{fe} \end{bmatrix}.$$

This is now in the correct form for implementation by a second PMQ.

The above example shows one of several strategies that can be adopted by an encoder. A simpler strategy is to compute $m_0$ as above, then to define $m_1$, apart from scaling, by subtracting a proportion $\lambda$ of $L_0$ from $R_0$ such that the coefficient of $L_f$ is zero. In this particular example, the sparsity of the original downmix specification results in this condition being satisfied with $\lambda=0$:

$$m_1(\text{unscaled}) = [0., .7500, -.1268, .8000, -.5000, .5000] \begin{bmatrix} L_f \\ R_f \\ L_s \\ R_s \\ C \\ L_{fe} \end{bmatrix}.$$

The zero value of the first coefficient avoids the need, when calculating the second PMQ, to consider the effect of the first PMQ. That is, $m_0$ can be substituted for $L_f$ in the above equation without making any other change. Applying scaling and permutation as discussed previously, we obtain:

$$m_1 = [0., 1.0000, -.1585, .9375, -.6250, .6250] \begin{bmatrix} m_0 \\ R_s \\ L_s \\ R_f \\ C \\ L_{fe} \end{bmatrix},$$

which is of the correct form for implementation by the second PMQ.

Although the above simplified procedure does not achieve orthogonality, it does avoid generating $m_0$ and $m_1$ that are nearly linearly dependent, for example if $L_0$ and $R_0$ themselves were nearly linearly dependent. The possibility that $L_0$ and $R_0$ are actually linearly dependent (i.e. are scaled versions of each other) must be tested for and treated as a special case.

Alternatively, in a more advanced encoder, the above orthogonality condition can be replaced by the condition that the cross-correlation of the signals $m_0$ and $m_1$ should be approximately zero. This condition can be satisfied by an appropriate choice of $\lambda$. The condition of zero cross-correlation minimises the energy in $m_1$, and in the absence of frequency dependence this would be effective in minimising the transmitted data rate. As explained in WO-A 96/37048, data rate in the presence of spectral variation is more dependent on information content than on energy. With typical audio signals, the energy and cross-correlation will be dominated by large low-frequency signals, which have little information content on account of their low bandwidth. Hence it is better to apply a spectral weighting, which will typically emphasise high frequencies before calculating cross correlation. Ideally the spectral weighting will be adapted to the signal itself, but it is complicated to determine an optimal or near-optimal weighting, and in practice a fixed weighting will suffice. For example, a digital filter whose z-transform is $$(1-z^{-1})^2$$

will have a response rising at 12 dB per octave over the low and mid-frequency part of the audio band, and this will generally be sufficient to suppress undue domination by large low-frequency signals.

In WO-A 96/37048, the preferred directions for the transmitted signals was disclosed as being the eigenvectors of a matrix that, in the absence of frequency-dependence, would have been the correlation matrix of the signals. Such a choice would lead to zero correlation between the transmitted signals. However computation of eigenvectors is time consuming, and the procedure outlined above wherein the zero correlation is achieved simply by subtraction leads to a data rate that theoretically differs little from that resulting from an eigenvector computation.

The procedures above for choosing the directions of the transmitted signals can also be applied generally, that is to encoders that do not compute a downmix, or to the processing of the remaining channels once a downmix has been extracted.

We now describe a procedure in which the vector directions of the transmitted channels are chosen one by one. A first input channel is chosen, and other channels are subtracted from it with coefficients chosen to minimise the energy in the signal remaining after the subtraction. A primitive matrix quantiser implements the subtraction and furnishes an output signal. Then another input channel is chosen, and again the other channels are subtracted by a PMQ. The PMQ furnishes the next output signal and has coefficients chosen to minimise the energy therein. The process is repeated until all input channels have been processed, or until all available PMQs have been used, or until it is considered not worth applying further matrix transformations. Any further input channels that have not been modified by PMQs are passed to the output without modification.

An improvement on this procedure would be to choose the subtraction so as to minimise some measure of entropy, or information content, of the signal rather than simply to minimise the energy. In WO-A 96/37048, the entropy was estimated by taking the integral over frequency of the logarithm of the spectrum, and it would be entirely possible to compute each minimisation with respect to this criterion. Minimisation of spectrally-weighted energy would be a less computationally-intensive alternative, and there are various ways of computing an appropriate spectral weighting in dependence on the signal. More economical still would be the use of a fixed frequency weighting, for example as provided by a digital filter having z-transform $(1-z^{-1})^2$.

It will be recognised by those skilled in the art of numerical matrix algebra that the above process is somewhat akin to the use of Gram-Schmidt Orthogonalisation to furnish an orthogonal set of vectors. By analogy it might be considered unnecessary, when considering the subtraction, to include vectors that have already been processed, since they are by construction orthogonal to the vectors that have not yet been processed. However this will not generally be true when a downmix is being encoded, nor will it be true if the minimisation is of entropy rather than energy. Hence in general, each PMQ will subtract both signals that have already been processed and input channels that have yet to be processed.

So far the order in which channels are chosen for modification has been considered to be arbitrary. In many cases the order may have little effect on the final data rate, but it can substantially affect the size of the coefficients in the subtraction. As MLP restricts coefficients to a maximum value of 2, this consideration is important. If the minimisation is of energy, or of energy with a fixed spectral weighting, this is extremely fast computationally and it is entirely possible to make an arbitrary selection on a trial basis and to reject that and try another if the coefficients are too big. Another heuristic is to choose for modification the channel whose energy, or spectrally weighted energy, is the smallest.

If the PMQ is implemented as in FIG. 8, it would be normal to choose a coefficient of +1 or −1 for the channel being modified. If the subtraction generates signals that overload, the coefficient may be reduced. It would be normal in MLP to reduce it to −0.5, using the LSB bypass method described above. This will provide an additional 6 dB of headroom, which will usually be sufficient. If it is not, there are several possibilities. The currently considered matrix transformation may be modified or abandoned: that is, the input channel may be transmitted without modification. Or, if another PMQ is available, it too may be configured for LSB bypass operation and allocated to the channel under consideration allowing a further 6 dB increase in headroom. The additional PMQ will be applied prior to the PMQ that implements the subtraction. The additional PMQ, being required simply to reduce the signal amplitude, will normally in MLP apply a coefficient of −0.5 to the channel being modified, and have zero coefficients otherwise.

A particular case where two or even three PMQs may be needed to process a channel is where a downmix specification has several coefficients of substantially the same magnitude. For example, although the PMQ that furnishes $m_0$ in the example above has all coefficients less than unity, the sum of absolute magnitudes of the coefficients is 2.627. Thus, even if the PMQ furnishing $m_0$ uses LSB bypass and scales the channel by 0.5, there is still a possibility of an increase in signal magnitude of a factor 1.313. This can happen if, on a given sample period, channels of the input achieve full modulation simultaneously and each has the same sign as its coefficient in the PMQ, or if each has the opposite sign as its coefficient. Overload can be avoided by allocating an additional PMQ implementing an LSB bypass prior the PMQ that furnishes $m_0$.

For clarity, the above description mentions only the PMQs implemented by the encoder. It will be understood that for each PMQ it uses, the encoder must specify a corresponding PMQ to be used in Matrix 1 by the lossless decoder, and that the decoder's PMQs must be applied in reverse order. In the case of LSB bypass, an encoder PMQ applying a coefficient of −0.5 to the channel being modified implies a decoder PMQ applying a coefficient of −2.0 to that channel. In the downmix case, the encoder must specify the coefficients for Matrix 0 in dependence on the choices made for $m_0$ and $m_1$. Further, if a channel has been scaled, the scaling factor must be taken into account in calculating subsequent downmix coefficients that will multiply the channel.

Encoding of Mixed-rate Content

The DVD-Audio specification allows for a recording to be carried on the disc using two sampling frequencies. For example, the frontal channels $L_f$, $R_f$ may be encoded at 96 kHz sampling rate, while the other channels may be encoded at 48 kHz in order to reduce the data rate. However, the preceding description of the simultaneous transmission of downmix information in a first substream assumes that the channels are all sampled simultaneously and, in particular, at the same sampling rate.

The article P. G. Craven, M. J. Law J. R. and Stuart, 'Lossless Compression using IIR Prediction Filters', *J. Audio Ezig. Soc.*, Abstracts, Mar. 1997, vol. 45, no. 5, p. 404 preprint no. 4415 explains that, when using lossless compression, it is not necessary to reduce the sampling rate in order to save data. It is sufficient to restrict the bandwidth of the signal because the lossless encoder will automatically respond to the reduction in information content of the signal and encode it to a lower bit rate.

An upsampled signal inherently has a restricted bandwidth. For example, a 96 kHz sampled signal has the ability to reproduce frequencies up to nearly 48 kHz, but such a signal will have very little energy above 24 kHz if it is derived by upsampling a 48 kHz sampled signal. Accordingly, when lossless compression is used on 'mixed-rate' material, it is possible, without significant adverse effect on the data-rate, to 'upsample' any channels that are presented at a lower rate, e.g., 48 kHz, before encoding so that all channels are encoded at the same sampling rate, e.g., 96 kHz. This unified sample rate makes possible the matrix operations required in order to implement the invention.

Figure 10:
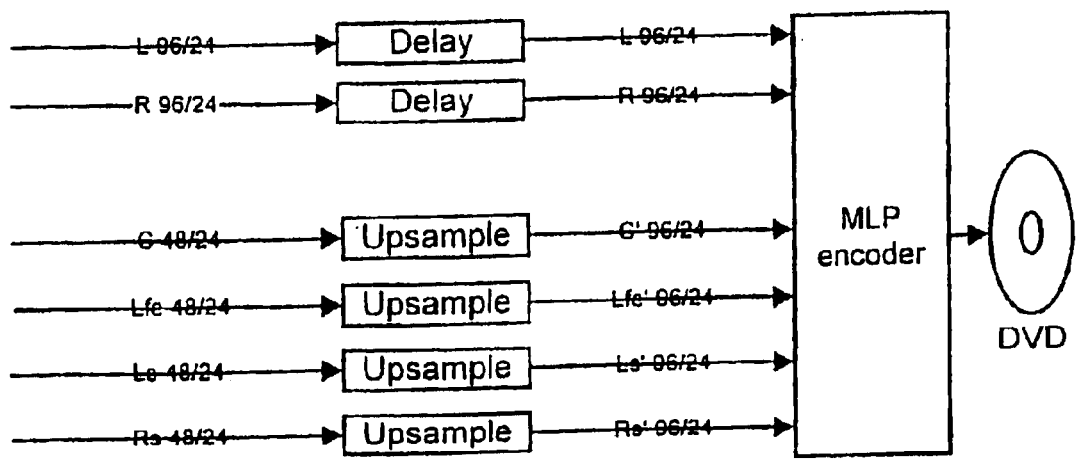
FIG. 10 shows an apparatus for encoding mixed-rate signal samples at 48 kHz and 96 kHz, comprising a lossless encoder preceded by an upsampler.

'Upsampling' is also known as 'interpolation' in the Digital Signal Processing literature, and the techniques for performing it are well known. FIG. 10 shows an encoder adapted to include this feature. As filtering involves delay, the channels $L_f$ and $R_f$ that do not require upsampling are given a compensating delay.

Interpolation filtering is in general not lossless, but in a preferred embodiment the 'upsample' filters in FIG. 10 are of the type known as 'half band filters'. When used for interpolation, half-band filters furnish an output with twice as many sampling points as the input sampling points. The even-numbered output points correspond to the input points and contain sample values identical to the input values, while the odd-numbered output points lie half way between the input values and contain interpolated values.

When a stream is encoded in this way, the player has two options. It may play the stream as if all the channels were originally sampled at 96 kHz. thus ignoring the differing provenance of even and odd samples. Alternatively the player may select only the even samples in the case of channels that were originally presented to the encoder at 48 kHz. In this case the player has access to a lossless reconstruction of the mixed-rate content that was presented to the encoder. In order to make this possible, the encoded stream must contain a specification of which channels were originally presented at the lower sampling rate, and an indication of which samples are to be regarded as 'even' and which are to be regarded as 'odd'. The latter may be implicit if the stream contains a block structure in which the number of samples in a block is always even. On DVD-Audio, the use of 'Access Units' and 'Presentation Units' provides such a structure.

The DVD-Audio specification provides similarly for mixed-rate content at 88.2 kHz and 44.1 kHz. The mixed-rate coding feature described above may also be applied to this case in a similar manner.

Implementation

The functions required to practice various aspects of the invention can be performed by components that are implemented in a wide variety of ways including discrete logic components, one or more ASICs and/or program-controlled processors. The manner in which these components are implemented is not critical. For example, operations required to practice these aspects of the invention can be implemented by in an apparatus that comprises one or more terminals for receiving and sending signals representing digital information, random access memory for storing the digital information, a medium for recording one or more programs of instructions, and a processor that executes the programs of instructions. The programs of instructions may be recorded by a variety machine readable media or other products of manufacture including various types of read-only memory, magnetic tape, magnetic disk, optical disc, or conveyed by baseband or modulated communication paths throughout the spectrum from supersonic to ultraviolet frequencies.

Various features of the encoding and decoding processes and apparatus have been described above. It is to be understood that, where these features can be implemented separately, it is envisaged that these features may be brought together in any combination, in order to benefit from the different advantages provided by those features. While the claims define various features independently, the features of all claims can be combined with each other and this disclosure is intended to include all such combinations.

What is claimed is:

1. A method for decoding an encoded signal representing a plurality of encoded channel signals, one or more least signficant bits and information representing a gain coefficient, wherein the method comprises:

receiving the encoded signal and obtaining therefrom the plurality of channel signals, the one or more least significant bits and the gain coefficient;

generating a modified first channel signal by applying a first primitive matrix quantiser to a first channel signal in said plurality of channel signals, wherein the first channel signal is multiplied by a gain coefficient; and combining the multiplied first channel signal with the one or more least significant bits.

2. The method according to claim 1 wherein the first primitive matrix quantizer forms a linear combination of the plurality of channel signals to generate the modified first channel signal.

3. The method according to claim 1, wherein the combining comprises adding.

4. The method according to claim 1 that applies an inverse matrix transformation to the plurality of channel signals using a cascade of primitive matrix quantisers, wherein the cascade of primitive matrix quantisers comprises the first primitive matrix quantiser.

5. The method according to claim 1 wherein the gain coefficient is not equal to an integer power of two.

6. A method for encoding a plurality of channel signals comprising:

generating a modified first channel signal by applying a first primitive matrix quantiser to a first channel signal in said plurality of channel signals, wherein the first channel signal is multiplied by the gain coefficient;

recovering one or mare least significant bits that result from the multiplying that exceed a number of bits allocated to the first channel signal; and assembling the one or more least significant bits, the multiplied modified first channel signal and a parameter representing the gain coefficient into an encoded signal.

7. The method according to claim 6 wherein the first primitive matrix quantizer forms a linear combination of the plurality of channel signals to generate the modified first channel signal.

8. The method according to claim 6 that applies a matrix transformation to the plurality of channel signals using a cascade of primitive matrix quantisers, wherein the cascade of primitive matrix quantisers comprises the first primitive matrix quantiser.

9. The method according to claim 6 wherein the gain coefficient is not equal to an integer power of two.

10. An apparatus for decoding an encoded signal representing a plurality of encoded channel signals, one or more least signficant bits and information representing a gain coefficient, wherein the apparatus comprises:

means for receiving the encoded signal and obtaining therefrom the plurality of channel signals, the one or more least significant bits and the gain coefficient;

means for generating a modified first channel signal by applying a first primitive matrix quantiser to a first channel signal in said plurality of channel signals, wherein the first channel signal is multiplied by a gain coefficient; and means for combining the multiplied first channel signal with the one or more least significant bits.

11. The apparatus according to claim 10 wherein the first primitive matrix quantizer forms a linear combination of the plurality of channel signals to generate the modified first channel signal.

12. The apparatus according to claim 10, wherein the combining comprises adding.

13. The apparatus according to claim 10 that comprises a means for applying an inverse matrix transformation to the plurality of channel signals using a cascade of primitive matrix quantisers, wherein the cascade of primitive matrix quantisers comprises the first primitive matrix quantiser.

14. The apparatus according to claim 10 wherein the gain coefficient is not equal to an integer power of two.

15. An apparatus for encoding a plurality of channel signals comprising:

means for generating a modified first channel signal by applying a first primitive matrix quantiser to a first channel signal in said plurality of channel signals, wherein the first channel signal is multiplied by the gain coefficient;

means for recovering one or more least significant bits that result from the multiplying that exceed a number of bits allocated to the first channel signal; and means for assembling the one or more least significant bits, the multiplied modified first channel signal and a parameter representing the gain coefficient into an encoded signal.

16. The apparatus according to claim 15 wherein the first primitive matrix quantizer forms a linear combination of the plurality of channel signals to generate the modified first channel signal.

17. The apparatus according to claim 15 that comprises a means for applying a matrix transformation to the plurality of channel signals using a cascade of primitive matrix quantisers, wherein the cascade of primitive matrix quantisers comprises the first primitive matrix quantiser.

18. The apparatus according to claim 15 wherein the gain coefficient is not equal to an integer power of two.

19. A medium that conveys a program of instructions that is executable by a device to perform a method for decoding an encoded signal representing a plurality of encoded channel signals, one or more least signficant bits and information representing a gain coefficient, wherein the method comprises:

receiving the encoded signal and obtaining therefrom the plurality of channel signals, the one or more least significant bits and the gain coefficient;

generating a modified first channel signal by applying a first primitive matrix quantiser to a first channel signal in said plurality of channel signals, wherein the first channel signal is multiplied by a gain coefficient; and combining the multiplied first channel signal with the one or more least significant bits.

20. The medium according to claim 19 wherein the first primitive matrix quantizer forms a linear combination of the plurality of channel signals to generate the modified first channel signal.

21. The medium according to claim 19, wherein the combining comprises adding.

22. The medium according to claim 19 that applies an inverse matrix transformation to the plurality of channel signals using a cascade of primitive matrix quantisers, wherein the cascade of primitive matrix quantisers comprises the first primitive matrix quantiser.

23. The medium according to claim 19 wherein the gain coefficient is not equal to an integer power of two.

24. A medium that conveys a program of instructions that is executable by a device to perform a method for encoding a plurality of channel signals, wherein the method comprises:

generating a modified first channel signal by applying a first primitive matrix quantiser to a first channel signal in said plurality of channel signals, wherein the first channel signal is multiplied by the gain coefficient;

recovering one or more least significant bits that result from the multiplying that exceed a number of bits allocated to the first channel signal; and assembling the one or more least significant bits, the multiplied modified first channel signal and a parameter representing the gain coefficient into an encoded signal.

25. The medium according to claim 24, wherein the first primitive matrix quantizer forms a linear combination of the plurality of channel signals to generate the modified first channel signal.

26. The medium according to claim 24 that applies a matrix transformation to the plurality of channel signals using a cascade of primitive matrix quantisers, wherein the cascade of primitive matrix quantisers comprises the first primitive matrix quantiser.

27. The medium according to claim 24 wherein the gain coefficient is not equal to an integer power of two.

28. A method for encoding a plurality of channel signals comprising:

receiving the plurality of channel signals and a downmix specification;

generating an encoded signal by applying a matrix to the plurality of channel signals, wherein the matrix is implemented by a cascade of primitive matrix quantisers and has matrix outputs that provide a plurality of substreams of encoded information, a first substream is provided by a strict subset of the matrix outputs, and the cascade of primitive matrix quantisers comprises:

a first primitive matrix quantiser having coefficients such that an output of the first primitive matrix quantiser is a first downmix channel signal in the first substream that corresponds to a first channel of the downmix specification multiplied by a scaling factor; and a second primitive matrix quantiser following the first primitive matrix quantiser in the cascade of primitive matrix quantisers and having a coefficient multiplying the first downmix channel signal that is substantially zero; and assembling a representation of the plurality of substreams of encoded information into an output signal.

29. The method according to claim 28, wherein the first primitive matrix quantiser modifies a channel signal in the plurality of channel signals that corresponds to a coefficient in the downmix specification that is substantially the largest coefficient in a specification for the first channel of the downmix specification.

30. A method for encoding a plurality of channel signals comprising:

receiving the plurality of channel signals and a downmix specification;

generating an encoded signal by applying a matrix to the plurality of channel signals, wherein the matrix is implemented by a cascade of primitive matrix quantisers and has matrix outputs that provide a plurality of substreams of encoded information, a first substream is provided by a strict subset of the matrix outputs, and a portion of the matrix that provides the first substream has rows of coefficients that are substantially orthogonal to one another; and assembling a representation of the plurality of sub streams of encoded information into an output signal.

31. The method according to claim 30, wherein a first primitive matrix quantiser in the cascade of primitive matrix quantisers modifies a channel signal in the plurality of channel signals that corresponds to a coefficient in the downmix specification that is substantially the largest coefficient in a specification for a first channel of the downmix specification.

32. A method for encoding a plurality of channel signals comprising:

receiving the plurality of channel signals and a downmix specification;

generating an encoded signal by applying a matrix to the plurality of channel signals, wherein the matrix is implemented by a cascade of primitive matrix quantisers and has matrix outputs that provide a plurality of substreams of encoded information, a first substream is provided by a strict subset of the matrix outputs, and the first substream comprises two or more channel signals in the downmix specification that have a cross-correlation with one another that is substantially equal to zero; and assembling a representation of the plurality of substreams of encoded information into an output signal.

33. The method according to claim 32, wherein a first primitive matrix quantiser in the cascade of primitive matrix quantisers modifies a channel signal in the plurality of channel signals that corresponds to a coefficient in the downmix specification that is substantially the largest coefficient in a specification for a first channel of the downmix specification.

34. The method according to claim 32, wherein the output signal has a data rate and the cross-correlation is given a spectral weighting that emphasises frequencies with greater contributions to the data rate.

35. The method according to claim 32, wherein the cross-correlation is given a spectral weighting as defined by a filter with a transfer function equal to $(1-z^{-1})^n$, where n=1, 2 or 3.

36. An apparatus for encoding a plurality of channel signals comprising:

means for receiving the plurality of channel signals and a downmix specification;

means for generating an encoded signal by applying a matrix to the plurality of channel signals, wherein the matrix is implemented by a cascade of primitive matrix quantisers and has matrix outputs that provide a plurality of substreams of encoded information, a first substream is provided by a strict subset of the matrix outputs, and the cascade of primitive matrix quantisers comprises:

a first primitive matrix quantiser having coefficients such that an output of the first primitive matrix quantiser is a first downmix channel signal in the first sub stream that corresponds to a first channel of the downmix specification multiplied by a scaling factor; and a second primitive matrix quantiser following the first primitive matrix quantiser in the cascade of primitive matrix quantisers and having a coefficient multiplying the first downmix channel signal that is substantially zero; and means for assembling a representation of the plurality of substreams of encoded information into an output signal.

37. The apparatus according to claim 36, wherein the first primitive matrix quantiser modifies a channel signal in the plurality of channel signals that corresponds to a coefficient in the downmix specification that is substantially the largest coefficient in a specification for the first channel of the downmix specification.

38. An apparatus for encoding a plurality of channel signals comprising:

means for receiving the plurality of channel signals and a downmix specification;

means for generating an encoded signal by applying a matrix to the plurality of channel signals, wherein the matrix is implemented by a cascade of primitive matrix quantisers and has matrix outputs that provide a plurality of substreams of encoded information, a first substream is provided by a strict subset of the matrix outputs, and a portion of the matrix that provides the first substream has rows of coefficients that are substantially orthogonal to one another; and means for assembling a representation of the plurality of substreams of encoded information into an output signal.

39. The apparatus according to claim 38, wherein a first primitive matrix quantiser in the cascade of primitive matrix quantisers modifies a channel signal in the plurality of channel signals that corresponds to a coefficient in the downmix specification that is substantially the largest coefficient in a specification for a first channel of the downmix specification.

40. An apparatus for encoding a plurality of channel signals comprising:

means for receiving the plurality of channel signals and a downmix specification;

means for generating an encoded signal by applying a matrix to the plurality of channel signals, wherein the matrix is implemented by a cascade of primitive matrix quantisers and has matrix outputs that provide a plurality of substreams of encoded information, a first substream is provided by a strict subset of the matrix outputs, and the first substream comprises two or more channel signals in the downmix specification that have a cross-correlation with one another that is substantially equal to zero; and means for assembling a representation of the plurality of substreams of encoded information into an output signal.

41. The apparatus according to claim 40, wherein a first primitive matrix quantiser in the cascade of primitive matrix quantisers modifies a channel signal in the plurality of channel signals that corresponds to a coefficient in the downmix specification that is substantially the largest coefficient in a specification for a first channel of the downmix specification.

42. The apparatus according to claim 40, wherein the output signal has a data rate and the cross-correlation is given a spectral weighting that emphasises frequencies with greater contributions to the data rate.

43. The apparatus according to claim 40, wherein the cross-correlation is given a spectral weighting as defined by a filter with a transfer function equal to $(1-z^{-1})^n$, where n=1, 2 or 3.

44. A medium that conveys a program of instructions that is executable by a device to perform a method for encoding a plurality of channel signals, wherein the method comprises:

receiving the plurality of channel signals and a downmix specification;

generating an encoded signal by applying a matrix to the plurality of channel signals, wherein the matrix is implemented by a cascade of primitive matrix quantisers and has matrix outputs that provide a plurality of substreams of encoded information, a first substream is provided by a strict subset of the matrix outputs, and the cascade of primitive matrix quantisers comprises:

a first primitive matrix quantiser having coefficients such that an output of the first primitive matrix quantiser is a first downmix channel signal in the first substream that corresponds to a first channel of the downmix specification multiplied by a scaling factor; and a second primitive matrix quantiser following the first primitive matrix quantiser in the cascade of primitive matrix quantisers and having a coefficient multiplying the first downmix channel signal that is substantially zero; and assembling a representation of the plurality of substreams of encoded information into an output signal.

45. The medium according to claim 44, wherein the first primitive matrix quantiser modifies a channel signal in the plurality of channel signals that corresponds to a coefficient in the downmix specification that is substantially the largest coefficient in a specification for the first channel of the downmix specification.

46. A medium that conveys a program of instructions that is executable by a device to perform a method for encoding a plurality of channel signals, wherein the method comprises:

receiving the plurality of channel signals and a downmix specification;

generating an encoded signal by applying a matrix to the plurality of channel signals, wherein the matrix is implemented by a cascade of primitive matrix quantisers and has matrix outputs that provide a plurality of substreams of encoded information, a first substream is provided by a strict subset of the matrix outputs, and a portion of the matrix that provides the first substream has rows of coefficients that are substantially orthogonal to one another; and assembling a representation of the plurality of substreams of encoded information into an output signal.

47. The medium according to claim 46, wherein a first primitive matrix quantiser in the cascade of primitive matrix quantisers modifies a channel signal in the plurality of channel signals that corresponds to a coefficient in the downmix specification that is substantially the largest coefficient in a specification for a first channel of the downmix specification.

48. A medium that conveys a program of instructions that is executable by a device to perform a method for encoding a plurality of channel signals, wherein the method comprises:

receiving the plurality of channel signals and a downmix specification;

generating an encoded signal by applying a matrix to the plurality of channel signals, wherein the matrix is implemented by a cascade of primitive matrix quantisers and has matrix outputs that provide a plurality of substreams of encoded information, a first substream is provided by a strict subset of the matrix outputs, and the first substream comprises two or more channel signals in the downmix specification that have a cross-correlation with one another that is substantially equal to zero; and assembling a representation of the plurality of sub streams of encoded information into an output signal.

49. The medium according to claim 48, wherein a first primitive matrix quantiser in the cascade of primitive matrix quantisers modifies a channel signal in the plurality of channel signals that corresponds to a coefficient in the downmix specification that is substantially the largest coefficient in a specification for a first channel of the downmix specification.

50. The medium according to claim 48, wherein the output signal has a data rate and the cross-correlation is given a spectral weighting that emphasises frequencies with greater contributions to the data rate.

51. The medium according to claim 48, wherein the cross-correlation is given a spectral weighting as defined by a filter with a transfer function equal to $(1-z^{-1})^n$, where n=1, 2 or 3.

52. In an encoder receiving a plurality of input signals and generating a plurality of output signals, a method of determining one or more of the output signals that comprises:

(i) choosing a first selected input signal; and (ii) choosing a first linear combination of signals that is a linear combination of at least some of the input signals that excludes the first selected input signal, the first linear combination of signals being chosen to reduce an entropy measure for a difference between the first selected signal and the first linear combination of signals, wherein the difference between the first selected input signal and the first linear combination of signals determines a first output signal in the plurality of output signals;

(iii) choosing a second selected input signal; and (iv) choosing a second linear combination of signals that is a linear combination of at least some of the input signals that excludes the second selected input signal, the second linear combination of signals being chosen to reduce an entropy measure for a difference between the second selected signal and the second linear combination of signals, wherein the difference between the second selected input signal and the second linear combination of signals determines a second output signal in the plurality of output signals.

53. The method as claimed in claim 52, wherein step (ii) comprises generating a first output signal that represents the difference between the first selected signal and the first linear combination of signals, and step (iv) comprises generating a second output signal that represents the difference between the second selected signal and the second linear combination of signals.

54. The method as claimed in claim 53, wherein the first output signal and the second output signal are generated by primitive matrix quantisers.

55. The method as claimed in claim 52, wherein the second linear combination is a linear combination of signals that excludes the first selected input signal.

56. The method as claimed in claim 52, wherein the second linear combination is a linear combination of signals that includes the first output signal.

57. The method as claimed in claim 52, wherein step (ii) generates a first output signal definition representing the difference between the first selected input signal and the first linear combination of signals;

step (iv) generates a second output signal definition representing the difference between the second selected input signal and the second linear combination of signals;

and wherein the method comprises:
(v) generating the first output signal from the first output signal definition, and generating the second output signal from the second output signal definition.

58. The method as claimed in claim 57, wherein the first output signal and the second output signal are generated by primitive matrix quantisers.

59. The method as claimed in claim 52 that further comprises determining a set of output signals from which a downmix of the input signals can be recovered, wherein at least one of the first combination and the second combination is a linear combination of signals that includes at least one signal in the set of output signals.

60. The method as claimed in claim 52, wherein steps (i) and (iii) select an input signal for which the absolute magnitudes of the coefficients in the linear combination do not exceed a predetermined limit.

61. The method as claimed in claim 52, wherein step (i) chooses for the first selected input signal that input signal having a smallest measure of energy, and step (iii) chooses for the second selected input signal that input signal other than the first selected input signal having a smallest measure of energy.

62. The method as claimed in claim 52, wherein step (ii) applies a first scaling factor to the difference between the first selected input signal and the first linear combination of other input signals to determine the first output signal, and step (iv) applies a second scaling factor to the difference between the second selected input signal and the second linear combination of other input signals to determine the second output signal.

63. The method as claimed in claim 62, wherein the first scaling factor is equal to +1, −1, ½ or −½ and the second scaling factor is equal to +1, −1, +½ or −½.

64. The method as claimed in claim 62, wherein step (ii) generates additional least significant bits by application of the first scaling factor having a magnitude less than unity and/or step (iv) generates additional least significant bits by application of the second scaling factor having a magnitude less than unity, and at least some of the additional least significant bits are provided in an output signal.

65. The method as claimed in claim 52, wherein the entropy measures are energy.

66. The method as claimed in claim 52, wherein the entropy measures are derived from energy calculated with a spectral weighting emphasizing the frequency bands that contribute more substantially to a data rate of a compressed output stream of the encoder.

67. The method as claimed in claim 52, wherein the entropy measures are derived from energy calculated with a spectral weighting substantially as defined by a digital filter $(1-z^{-1})^n$, where n=1, 2 or 3.

68. An encoder for receiving a plurality of input signals, generating a plurality of output signals, and determining one or more of the output signals, wherein the encoder comprises:
(i) means for choosing a first selected input signal; and
(ii) means for choosing a first linear combination of signals that is a linear combination of at least some of the input signals that excludes the first selected input signal, the first linear combination of signals being chosen to reduce an entropy measure for a difference between the first selected signal and the first linear combination of signals, wherein the difference between the first selected input signal and the first linear combination of signals determines a first output signal in the plurality of output signals;
(iii) means for choosing a second selected input signal; and
(iv) means for choosing a second linear combination of signals that is a linear combination of at least some of the input signals that excludes the second selected input signal, the second linear combination of signals being chosen to reduce an entropy measure for a difference between the second selected signal and the second linear combination of signals, wherein the difference between the second selected input signal and the second linear combination of signals determines a second output signal in the plurality of output signals.

69. The encoder as claimed in claim 68, wherein the means for choosing the first linear combination generates a first output signal that represents the difference between the first selected signal and the first linear combination of signals, and the means for choosing the second linear combination generates a second output signal that represents the difference between the second selected signal and the second linear combination of signals.

70. The encoder as claimed in claim 69, wherein the first output signal and the second output signal are generated by primitive matrix quantisers.

71. The encoder as claimed in claim 68, wherein the second linear combination is a linear combination of signals that excludes the first selected input signal.

72. The encoder as claimed in claim 68, wherein the second linear combination is a linear combination of signals that includes the first output signal.

73. The encoder as claimed in claim 68, wherein
the means for choosing the first linear combination generates a first output signal definition representing the difference between the first selected input signal and the first linear combination of signals;
the means for choosing the second linear combination generates a second output signal definition representing the difference between the second selected input signal and the second linear combination of signals;
and wherein the encoder comprises:
means for generating the first output signal from the first output signal definition, and generating the second output signal from the second output signal definition.

74. The encoder as claimed in claim 73, wherein the first output signal and the second output signal are generated by primitive matrix quantisers.

75. The encoder as claimed in claim 68 that further comprises a means for determining a set of output signals from which a downmix of the input signals can be recovered, wherein at least one of the first combination and the second combination is a linear combination of signals that includes at least one signal in the set of output signals.

76. The encoder as claimed in claim 68, wherein the means for choosing the first selected input signal and the means for choosing the second selected input signal select an input signal for which the absolute magnitudes of the coefficients in the linear combination do not exceed a predetermined limit.

77. The encoder as claimed in claim 68, wherein the means for choosing the first selected input signal chooses for the first selected input signal that input signal having a smallest measure of energy, and the means for choosing the second selected input signal chooses for the second selected input signal that input signal other than the first selected input signal having a smallest measure of energy.

78. The encoder as claimed in claim 68, wherein the means for choosing the first linear combination applies a first scaling factor to the difference between the first selected input signal and the first linear combination of other input signals to determine the first output signal, and the means for choosing the second linear combination applies a second scaling factor to the difference between the second selected input signal and the second linear combination of other input signals to determine the second output signal.

79. The encoder as claimed in claim 78, wherein the first scaling factor is equal to +1, +1, ½ or −½ and the second scaling factor is equal to +1, −1, +½ or −½.

80. The encoder as claimed in claim 78, wherein the means for choosing the first linear combination generates additional least significant bits by application of the first scaling factor having a magnitude less than unity and/or the means for choosing the second linear combination generates additional least significant bits by application of the second scaling factor having a magnitude less than unity, and at least some of the additional least significant bits are provided in an output signal.

81. The encoder as claimed in claim 68, wherein the entropy measures are energy.

82. The encoder as claimed in claim 68, wherein the entropy measures are derived from energy calculated with a spectral weighting emphasizing the frequency bands that contribute more substantially to a data rate of a compressed output stream of the encoder.

83. The encoder as claimed in claim 68, wherein the entropy measures are derived from energy calculated with a spectral weighting substantially as defined by a digital filter $(1-z^{-1})^n$, where n=1, 2 or 3.

84. A medium that conveys a program of instructions that is executable by a device to perform a method in an encoder receiving a plurality of input signals and generating a plurality of output signals, wherein the method determines one or more of the output signals and comprises:
  (i) choosing a first selected input signal; and
  (ii) choosing a first linear combination of signals that is a linear combination of at least some of the input signals that excludes the first selected input signal, the first linear combination of signals being chosen to reduce an entropy measure for a difference between the first selected signal and the first linear combination of signals, wherein the difference between the first selected input signal and the first linear combination of signals determines a first output signal in the plurality of output signals;
  (iii) choosing a second selected input signal; and
  (iv) choosing a second linear combination of signals that is a linear combination of at least some of the input signals that excludes the second selected input signal, the second linear combination of signals being chosen to reduce an entropy measure for a difference between the second selected signal and the second linear combination of signals, wherein the difference between the second selected input signal and the second linear combination of signals determines a second output signal in the plurality of output signals.

85. The medium as claimed in claim 84, wherein step (ii) comprises generating a first output signal that represents the difference between the first selected signal and the first linear combination of signals, and step (iv) comprises generating a second output signal that represents the difference between the second selected signal and the second linear combination of signals.

86. The medium as claimed in claim 85, wherein the first output signal and the second output signal are generated by primitive matrix quantisers.

87. The medium as claimed in claim 84 wherein the second linear combination is a linear combination of signals that excludes the first selected input signal.

88. The medium as claimed in claim 84, wherein the second linear combination is a linear combination of signals that includes the first output signal.

89. The medium as claimed in claim 84, wherein
  step (ii) generates a first output signal definition representing the difference between the first selected input signal and the first linear combination of signals;
  step (iv) generates a second output signal definition representing the difference between the second selected input signal and the second linear combination of signals;
and wherein the method comprises:
  (v) generating the first output signal from the first output signal definition, and generating the second output signal from the second output signal definition.

90. The medium as claimed in claim 89, wherein the first output signal and the second output signal are generated by primitive matrix quantisers.

91. The medium as claimed in claim 84, wherein the method further comprises determining a set of output signals from which a downmix of the input signals can be recovered, wherein at least one of the first combination and the second combination is a linear combination of signals that includes at least one signal in the set of output signals.

92. The medium as claimed in claim 84, wherein steps (i) and (iii) select an input signal for which the absolute magnitudes of the coefficients in the linear combination do not exceed a predetermined limit.

93. The medium as claimed in claim 84, wherein step (i) chooses for the first selected input signal that input signal having a smallest measure of energy, and step (iii) chooses for the second selected input signal that input signal other than the first selected input signal having a smallest measure of energy.

94. The medium as claimed in claim 84, wherein step (ii) applies a first scaling factor to the difference between the first selected input signal and the first linear combination of other input signals to determine the first output signal, and step (iv) applies a second scaling factor to the difference between the second selected input signal and the second linear combination of other input signals to determine the second output signal.

95. The medium as claimed in claim 94, wherein the first scaling factor is equal to +1, −1, +½ or −½ and the second scaling factor is equal to +1, −1, +½ or −½.

96. The medium as claimed in claim 94, wherein step (ii) generates additional least significant bits by application of the first scaling factor having a magnitude less than unity and/or step (iv) generates additional least significant bits by application of the second scaling factor having a magnitude less than unity, and at least some of the additional least significant bits are provided in an output signal.

97. The medium as claimed in claim 84, wherein the entropy measures are energy.

98. The medium as claimed in claim 84, wherein the entropy measures are derived from energy calculated with a spectral weighting emphasizing the frequency bands that contribute more substantially to a data rate of a compressed output stream of the encoder.

99. The medium as claimed in claim 84, wherein the entropy measures are derived from energy calculated with a spectral weighting substantially as defined by a digital filter $(1-z^{-1})^n$, where n=1, 2 or 3.

* * * * *